(12) United States Patent
Wu et al.

(10) Patent No.: US 6,395,685 B1
(45) Date of Patent: May 28, 2002

(54) THIN FILM HG-BASED SUPERCONDUCTORS, THERMOELECTRIC MATERIALS AND METHODS OF FABRICATION THEREOF

(75) Inventors: Judy Wu, Lawrence, KS (US); Shao Lin Yan, Tianjin (CN); Yiyuan Xie, Lawrence, KS (US)

(73) Assignee: The University of Kansas, Lawrence, KS (US)

( * ) Notice: Subject to any disclaimer, the term of this patent is extended or adjusted under 35 U.S.C. 154(b) by 0 days.

(21) Appl. No.: 09/843,964

(22) Filed: Apr. 27, 2001

Related U.S. Application Data

(60) Division of application No. 09/427,428, filed on Oct. 26, 1999, now abandoned, which is a continuation-in-part of application No. 09/299,200, filed on Apr. 23, 1999, now abandoned, which is a continuation-in-part of application No. 09/067,401, filed on Apr. 27, 1998, now abandoned.

(51) Int. Cl.$^7$ .................. C04B 35/622; C23C 10/04
(52) U.S. Cl. ........................ 505/473; 505/501
(58) Field of Search ............... 505/120, 125, 505/473, 501, 783

(56) References Cited

U.S. PATENT DOCUMENTS

| | | | | |
|---|---|---|---|---|
| 5,883,050 A | * | 3/1999 | Yun et al. ............ | 505/125 |
| 6,060,433 A | * | 5/2000 | Li et al. .............. | 505/473 |

OTHER PUBLICATIONS

Lan et al "High critical current density in epitaxial HgBa2CaCu2Ox thin films", Applied Physics Letters, vol. 73, No. 20, pp. 2989–2991. Nov. 1998.*

Hur et al "Synthesis and characterization of a new mercury–based superconductor, Hg0.5Tl0.5Ba2Ca1–xSrxCu2O6+x", Physica C, 1994) pp. 4–8.*

Moriwaki et al "Epitaxial HgBa2Ca2Cu3Oy films on SrTiO3 substrates . . . ", Applied Physics Letters, vol. 69, No. 22, pp 3423–3425. Nov. 1996.*

Yun et al "Growth of HgBa2Ca2Cu3O8+x thin films on LaAIO3 substrates using fast temperature ramping Hg–vapor annealing", Applied Physics Letters, vol. 68, No. 18, pp. 2565–2567. Apr. 1996.*

Yu et al "HgBa2CaCu2Oy superconducting thin films prepared by laser ablation", Physica C 289 (1997) 199–202.*

Meng et al "Synthesis of the high–temperature superconductor HgBa2CaCu2O6+x and HgBa2Ca2Cu3O8+y", Physica C 216 (1993) 21.28.*

Hilton et al "Growth, patterning, and weak–link fabrication of superconducting YBa2Cu3O7–y thin films", Applied Physics Letters, vol. 53, No. 12, pp. 1107–1109. Sep. 1988.*

\* cited by examiner

*Primary Examiner*—Mark Kopec
(74) *Attorney, Agent, or Firm*—Hovey Williams LLP

(57) ABSTRACT

Improved Hg-containing superconducting films and thermoelectric materials are provided. The films are fabricated by annealing starting Tl-containing films (e.g., Tl-1212 or Tl-2212) in an Hg-vapor environment so as to cause a substitution of Tl by Hg without substantial alteration of the crystalline structure of the starting films. Preferably, a body comprising a substrate having an epitaxial Tl-containing film thereon is annealed under vacuum conditions with a Hg-based bulk; typical annealing conditions are 600–900° C. for a period of from about 1–20 hours. The final Hg-containing film products have a $J_c$ of at least about $10^6$ A/cm$^2$ (100 K, OT) and a $X_{min}$ of up to about 50%. The thermoelectric materials are prepared by perturbing a crystalline precursor having a structure similar to the final material so as to cause a first molecule to be released from the precursor. A vapor is introduced into the reaction system simultaneous to or shortly after the perturbation step so as to cause molecules which are within the vapor and are different than the first molecules to replace the first molecules in the precursor.

14 Claims, 20 Drawing Sheets

*Fig. 7.*

| 52 48 44 39 35 31 26 22 17 13 9 4 0 | jwu4
jwu41.003
02/09/98    Created     12:05:32
            Mag,Quad    10/15/97
            Phi         1      0
            Width       90.000
            Counts      90.000
            Time (s)    48773
            Distance    60.056
            Size        15.030
                        1024

Frame was taken at
2-Theta     34.440
Omega       17.220
Phi         90.000
Chi         47.640

2Theta      324.300
Omega       165.200
Phi         8.355
Chi         89.552
Shutter     CLOSED
Distance    17.620
FloodFld    1024_018
Spatial     1024_018
1024x1024   Cu Bias ARMY RESEARCH LABORATORY – Dr. STEVEN TIDROW – 02/09/98

Hg-vapor Annealed Tl-2212 Micro-Bridges

20 μm × 80 μm

10 μm × 40 μm

Low Temperature (~700°C) Annealing

THIN FILM HG-BASED SUPERCONDUCTORS, THERMOELECTRIC MATERIALS AND METHODS OF FABRICATION THEREOF

RELATED APPLICATIONS

This application is a divisional of application Ser. No. 09/427,428, filed Oct. 26, 1999 now abandoned, which is a continuation-in-part of U.S. patent application Ser. No. 09/299,200, filed Apr. 23, 1999 now abandoned, which is a continuation-in-part of U.S. patent application Ser. No. 09/067,401, filed Apr. 27, 1998, now abandoned.

BACKGROUND OF THE INVENTION

1. Field of the Invention

The present invention is broadly concerned with improved methods for forming superconducting materials and thermoelectric materials comprising highly volatile elements. In one embodiment, the methods are useful for the production of highly epitaxial Hg-containing film superconductors exhibiting very high $J_c$ values, along with novel films of this character. In another embodiment, the methods are useful for the production of thermoelectric materials which have very low thermal conductivities. In either embodiment, a process is carried out whereby precursor structures including a nonvolatile element are subjected to energy in the presence of a vapor comprising a volatile element so as to cause the nonvolatile element to be replaced by the volatile element without substantial alteration of the crystalline structure of the precursor.

2. Description of the Prior Art

Hg-based superconductors have a record high superconducting transition temperature ($T_c$~135K). Since a higher $T_c$ promises higher device operation temperature and a better stability at a given temperature, it is very important to develop viable technologies for fabrication of high-quality Hg-based superconducting films. Prior technologies generally involve two steps: deposition of amorphous rare-earth cuprate precursor films with or without Hg, followed by Hg-vapor annealing at temperatures above 800° C. under a controlled Hg-vapor pressure in order to form the superconducting phases.

All high $T_c$ superconductors have layered structures and their physical properties are anisotropic parallel or perpendicular to the layers. The alignment of grains during the growth is crucial for the quality of the films. Since most applications of the superconductor require the capability of carrying high current, epitaxial growth of grains is essential.

Since Hg-based compounds are volatile, the control of the growth conditions is very difficult using conventional techniques. Though c-axis-oriented superconducting Hg-1212 and Hg-1223 films have been obtained with their $T_c$ up to 124K and 130K, respectively, high-quality epitaxial growth has not been achieved. In other words, the superconducting grains are connected more or less randomly in the plane of the substrates. This lack of epitaxy is reflected in the poor x-ray pole figures and high $X_{min}$ values of prior Hg-1212 and Hg-1223 films, which are on the order of 100%.

A direct effect of this substantial non-epitaxy is that the $J_c$ values of the films are much lower than expected in view of the intragrain $J_c$ values and the high irreversibility line of the Hg-based superconductors. When current passes grain boundaries, it is significantly reduced owing to the fact that the grains are not aligned epitaxially. The other effect of this non-epitaxy is a relatively rough film surface which hinders many potential applications of the Hg-based superconducting thin films, e.g., for use in microelectronics.

The volatility of Hg presents a particular problem in the fabrication of micro-bridges in microelectronic devices. Because Hg-based superconductors are so delicate and tend to react with etching chemicals and water, fabrication of the Hg-containing micro-bridges directly from Hg-containing films using regular photolithography processes generally results in degradation of the samples. This, in turn, leads to unreliable connections in the circuit.

There is accordingly a real and unsatisfied need in the art for an improved method of fabricating Hg-containing superconductors to yield films having a high degree of epitaxy and correspondingly high $T_c$ and $J_c$ values.

The properties of thermoelectric materials are demonstrated by calculating the figure of merit $ZT=TS^2/\kappa\rho$, where T is the operating temperature of the material, S is the Seebeck coefficient, $\rho$ is the resistivity, and K is the thermal conductivity of the material. Current state-of-the-art Peltier refrigerators use semiconducting $Bi_2Te_3$—$Sb_2Te_3$ alloys (with a ZT of <1) that only produce moderate amounts of cooling and are inefficient compared to compressor-based refrigerators. As a result, thermoelectric refrigerators are generally used in applications where reliability and convenience are more important than economy.

Many attempts have been made to design improved thermoelectric materials having a higher ZT. Theoretically, a solid that is simultaneously a poor conductor of heat and a good conductor of electricity (the "electron crystal and phonon glass") could have a ZT as high as 2–4, making it ideal for thermoelectric applications.

It has been proposed that synthesizing semiconducting compounds in which one of the atoms or molecules is weakly bound in an oversized atomic cage would cause the weakly bound atom to undergo local anharmonic vibrations, somewhat independent of the other atoms in the crystal, forming what is known as a "rattler." These localized rattlers can, in some cases, dramatically lower the phonon thermal conductivity ($\kappa_{lattice}$) to values comparable to that of a glass of the same composition. The theoretical lower limit of $\kappa^{lattice}$ is designated $\kappa_{min}$ and corresponds to the thermal conductivity of an amorphous solid in which the mean-free path of the heat-carrying phonons approaches the order of the phonon wavelength. In an electrically conducting solid, heat is transported by both the charge carriers (electrons or holes) and phonons (lattice); hence, $\kappa=\kappa_{electron}+\kappa^{lattice}$. Therefore, a significantly enhanced ZT is expected from a minimized $\kappa^{lattice}$.

One class of materials that satisfies many of the requirements of an electron-crystal and phonon-glass solid is the filled skutterudites. Filled skutterudites have the general formula $RM_4X_{12}$, where typically: X is P, As, or Sb; M is Fe, Ru, or Os; and R is La, Ce, Pr, Nd, or Eu. Skutterudites are body-centered, cubic crystals with 34 atoms in the conventional unit cell and a space group of Im3. This structure consists of square, planar rings of four pnicogen atoms (i.e., X from the general formula) with rings of four oriented along either the (100), (010), or (001) crystallographic directions. The metal atoms M form a simple cubic sublattice, and the rattler atoms R are positioned in the two remaining holes in the unit cell. The structure of filled skutterudites differs from basic skutterudites in that basic skutterudites do not contain a rattler atom R. It has previously been shown that the $\kappa^{lattice}$ of filled skutterudite antimonides is nearly an order of magnitude lower than that of the basic skutterudites due to the presence of the rattling atoms R.

Filled skutterudites are difficult to synthesize in pure form by conventional arc melting processes. Moreover, the observed low $\kappa^{lattice}$ of these filled skutterudite antimonides is still significantly higher than the predicted $\kappa^{min}$. There are a few possible sources for this problem, one of which is the presence of impurity phases such as $RX_2$ or $MX_2$. Another possible source may be that the filled skutterudites generated thus far are not actually similar to phonon glasses. Thus, the R elements used likely do not have sufficiently large anharmonic deflection to allow the skutterudites to approach the phonon glass limit.

SUMMARY OF THE INVENTION

The present invention overcomes the problems outlined above and provides new methods for the production of desirable high $T_c$ and $J_c$ (both magnetic and transport) value Hg-containing film superconductors having significantly improved epitaxial characteristics. As is conventional in the art, transport $J_c$ refers to the measure of current density through a film when a current is directly applied to the film whereas magnetic $J_c$ refers to the measure of current density through a film that is induced by the application of a magnetic field to the film. The present invention also provides methods for the production of thermoelectric materials having high ZT's and low thermal conductivities. As is conventional in the art, $ZT=TS^2/\kappa\rho$, where T is the maximum operating temperature of the material, S is the Seebeck coefficient, $\rho$ is the resistivity, and $\kappa$ is the thermal conductivity of the material.

Generally speaking, the processes of forming superconductor films involves initial production of Tl-based superconducting films using known Tl-vapor annealing techniques, followed by Hg-vapor annealing to replace at least a portion of the Tl by Hg so that the desired Hg-based superconducting films are obtained. Tl-based superconducting films have similar crystalline structures to Hg-based superconducting films, but the $T_c$ and especially $J_c$ values at high temperature above 77K of the Tl-films are much lower. However, Tl is much less volatile than Hg and has a higher sticking coefficient. These factors make it much easier to grow Tl-based superconducting films that have greatly superior epitaxial properties (i.e., the grains are more uniformly aligned and are not randomly positioned on the substrate) compared to prior art films. When such precursor films are placed in an Hg-vapor environment and heated to elevated temperatures, Tl is driven out of the starting films and replaced by Hg simultaneously. Using appropriate time/temperature annealing conditions, it has been found that this exchange can occur without significantly altering the overall crystalline structure, so that high quality epitaxial Hg-based superconducting films can be obtained.

Thus, the methods of the invention broadly involve first providing a body made up of a substrate having a Tl-based superconducting film supported on a surface thereof, followed by annealing the body in the presence of Hg vapor and under conditions whereby at least a portion of the Tl of the starting superconducting film is replaced by Hg. Generally, this Hg-vapor annealing is carried out at a temperature of from about 600–900° C. for a period of from about 1–20 hours, and more preferably at a temperature of from about 640–800° C. for a period of from about 2–15 hours.

In applications where it is desirable to form microbridges, the Tl-based superconducting film is patterned and etched using conventional photolithography and etching techniques (i.e., a photoresist composition is applied to the film, exposed to activating radiation, developed, and etched). The remaining Tl film and newly formed microbridges are then annealed in the presence of Hg vapor as described above. The width of the micro-bridges is generally from about 2–10 µm.

The most desirable Tl-based starting superconducting films for making Hg-1212 superconducting films are selected from the group consisting of Tl-1212 and Tl-2212 films (i.e., $TlBa_2CaCu_2O_7$ and $Tl_2Ba_2CaCu_2O_8$), preferably yielding $HgBa_2CaCu_2O_x$ films wherein x ran from about 5.8–6.2. The most desirable Tl-based starting superconducting films for making Hg-2223 superconducting films are selected from the group consisting of Tl-1223 and T1-2223 (i.e., $TlBa_2Ca_2Cu_3O_9$ and $Tl_2Ba_2Ca_2Cu_3O_{10.5}$), preferably yielding $HgBa_2Ca_2Cu_3O_x$ films wherein x ranges from about 7.8–8.2. These are generally formed on a substrate, usually a single crystal substrate such as $LaAlO_3$, by known techniques to form a highly epitaxial film.

The Hg-vapor annealing step can be carried out in a number of different ways. FIG. 1 sets forth a number of different orientations of the starting Tl-film bodies (shown as rectangles) with respect to a superconducting Hg-containing pellet and optionally in the presence of a Ba—Ca—Cu—O oxide pellet. It will be understood that these various annealing configurations are in practice preferably placed within a quartz tube (not shown in FIG. 1) whereupon a vacuum (on the order of from about $10^{-4}$ to 1 Torr) is drawn and the tube is sealed. This sealed tube is then placed within the annealing furnace.

The final Hg-containing films are preferably either Hg-1212 or Hg-1223 films and usually have a thickness of from about 0.005–500 µm and more preferably from about 0.1–1 µm. In addition, the final Hg-containing films and micro-bridges formed of these films have very high transport and magnetic $J_c$ values of at least about $10^6$ A/cm², preferably at least about $2 \times 10^6$ A/cm², and more preferably at least about $2.3 \times 10^6$ A/cm² at 100K and zero magnetic field and $T_c$ values of from about 112–125K for Hg-1212 films (as used herein, $T_c$ values refer to $T_c$ (R=0), rather than onset $T_c^{onset}$ values). These $J_c$ values are quite significant because the prior art Hg-containing films, and particularly Hg-1212 films, have only been able to achieve $J_c$ values of $10^6$ A/cm² at 77K and zero magnetic field. Furthermore, these prior art $J_c$ values are magnetic $J_c$ values and not transport $J_c$ values. Because $J_c$ depends on both the superconductivity of the molecule applied to the substrate as well as the manner in which the molecule grains are positioned on the substrate (i.e., the epitaxy), the current densities of films at higher temperatures are unpredictable based upon the current densities of the films at lower temperatures. The highly epitaxial character of the Hg-containing films of the invention is confirmed by the x-ray pole figures and $X_{min}$ values thereof which are up to about 50%, and more preferably from about 10–40%. Finally, Hg-1212 films according to the invention have a low microwave surface resistance of less than about 0.4 mΩ and preferably less than about 0.3 mΩ at 120K, values that have never been obtained above 100K in prior art superconductors.

The processes of forming thermoelectric materials according to the invention comprises providing, in a reaction vessel, a three-dimensional, crystalline precursor comprising a plurality of atoms and at least one molecule weakly bonded thereto. As used herein, molecule is intended to include elements as well as ions derived from those elements. For example, "lanthanum molecule" is intended to include elemental lanthanum as well as lanthanum ions.

The precursor is then perturbed, causing the bond(s) between the molecule and the atoms to break, thus releasing the molecule from the precursor. The perturbing step can be accomplished by any method which subjects the crystalline precursor to energy of perturbation. Suitable methods include heat, light, ion beams, etc. When heat is utilized, the temperature to which the precursor is heated should be at least about 500° C., and preferably at least about 1000° C., depending upon the particular molecule which is weakly bonded to the precursor.

Either simultaneous to or shortly after the perturbing step, vapor under a controlled pressure and comprising a second molecule is introduced into the reaction vessel so that the second molecule replaces the released first molecule within the precursor. Preferably, the remaining crystalline structure of the precursor (i.e., structure other than the first molecule) remains essentially unaltered during this process.

Generally, any crystalline structure can be utilized as the crystalline precursor in the inventive processes, with body-centered crystals, orthorhombic crystals (such as perovskites), and cubic crystals being particularly preferred. One suitable type of body-centered crystal is the skutterudite having the general formula $RM_4X_{12}$, where M is a metal atom and R is a "rattler." Preferred metal atoms M are Fe, Ru, and Os, while preferred rattlers R (for use as the first molecule) are selected from the group consisting of La, Ce, Pr, Nd, and Eu. "X" in the general formula $RM_4X_{12}$ is preferably a pnicogen atom (e.g., P, As, Sb).

Any volatile molecule that is desired in the precursor at the same location as the first molecule can be utilized as the second molecule. Again, the same definition of molecule discussed above is intended to apply with respect to the second molecule. Thus, if a vapor of Hg is utilized, that vapor could comprise elemental Hg or Hg ions. Examples of suitable candidates for second molecules include those selected from the group consisting of Pb, Hg, Sn, In, Tl, and Ga. Because the second molecule is more volatile than the first molecule, it will have increased "rattling" abilities compared to the first molecule (i.e., increased local anharmonic vibrations around the rattler site). Thus, due to the presence of the volatile second molecule, the resulting thermoelectric materials have a phonon thermal conductivity ($\kappa_{lattice}$) at room temperature of less than about 0.012 W/cm-K, preferably less than about 0.01 W/cm-K, and more preferably less than about 0.007 W/cm-K. This low $\kappa_{lattice}$ contributes to thermoelectric materials having a ZT of at least about 2, preferably at least about 3, and more preferably at least about 3.5.

BRIEF DESCRIPTION OF THE DRAWINGS

FIG. 7 is an XRD pole figure of a Hg-1212 film (Run No. 3);

DETAILED DESCRIPTION OF THE PREFERRED EMBODIMENT

The following example sets forth preferred techniques for the production of metal-substituted superconducting epitaxial thin films, as well as characterizing results for the films. The examples also describe preferred methods of fabricating the inventive thermoelectric materials. It is to be understood that these examples are provided by way of illustration only, and nothing therein should be taken as a limitation upon the overall scope of the invention.

FABRICATION OF SUPERCONDUCTING FILMS

Examples 1–4 are directed towards methods of forming superconducting films according to the processes of the invention.

EXAMPLE 1

In this example, a series of Hg-1212 epitaxial films were produced using the Hg substitution technique. In the first step, a series of approximately 3×3×.5 mm single crystal lanthium aluminate ($LaAlO_3$) blocks were provided. A surface of each of these blocks was coated with either Tl-2212 ($Tl_2Ba_2CaCu_2O_8$) or Tl-1212 ($TlBa_2CaCu_2O_8$) using the DC magnetron sputtering technique as described by Yan et al., *Appl. Phys. Lett.*, 63:1845 (1993); Yan et al, *Supercond. Sci. Technol.*, 7:681 (1994) and Siegal et al, *J. Mater. Res.*, 12:2825 (1997). Thereafter, the coated blocks were annealed at a temperature of about 740–780° C. for a period of about 6 hours in an enclosed crucible formed of either solid $Tl_2Ba_2CaCu_2O_8$ (for the Tl-2212 coated blocks) or $TlBa_2CaCu_2O_{6.5}$ (for the Tl-1212 coated blocks), with pure argon gas. This created an epitaxial film of superconducting $Tl_2Ba_2CaCu_2O_8$ or $TlBa_2CaCu_2O_{6.5}$ on the blocks. These epitaxial films had a thickness of about 0.3 μm. The epitaxial nature of the films was confirmed by XRD pole figure and RBS/channeling.

In the next step, each of the blocks was subjected to Hg substitution to create epitaxial Hg-1212 films thereon. Generally speaking, this was accomplished by placing the blocks adjacent an Hg-containing body ($Hg_{1-y}Ba_2Ca_2Cu_3O_x$, wherein y ranged from 0–0.5), and sometimes an additional body of non Hg-containing oxide (a mixture of BaO, CaO and CuO in a nominal 223 ratio) in a quartz tube (7 mm I.D., 10 mm O.D., 2.5 cm in length). One end of the quartz tube was then closed and a vacuum (~10–2 Torr) was drawn in the tube, whereupon the remaining end of the quartz tube was fused. The closed quartz tube was then placed within an elongated stainless steel pipe (about ½ inch I.D.) and this was placed within a conventional tube furnace. At this point, the contents of the quartz tube were heated at an ascending rate of 10–50° C./min. to an annealing temperature, the annealing temperature was held for a period of hours (annealing period), and thereafter the quartz tube was furnace cooled until ambient temperature was reached.

Figure 1:
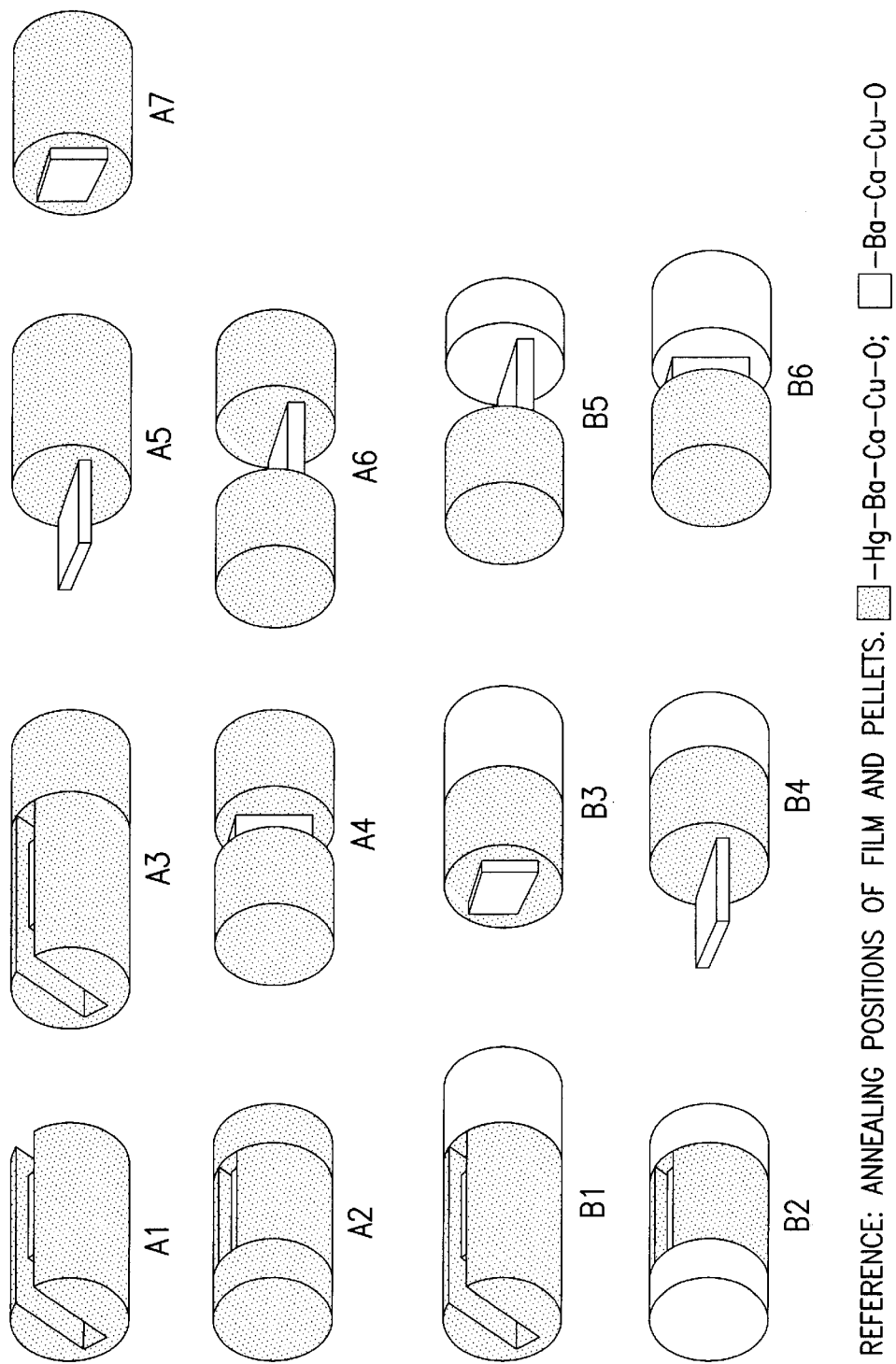
FIG. 1 is a schematic representation of a number of exemplary annealing configurations which can be used in the preparation of the thin film superconductors of the invention.
Figure 2:
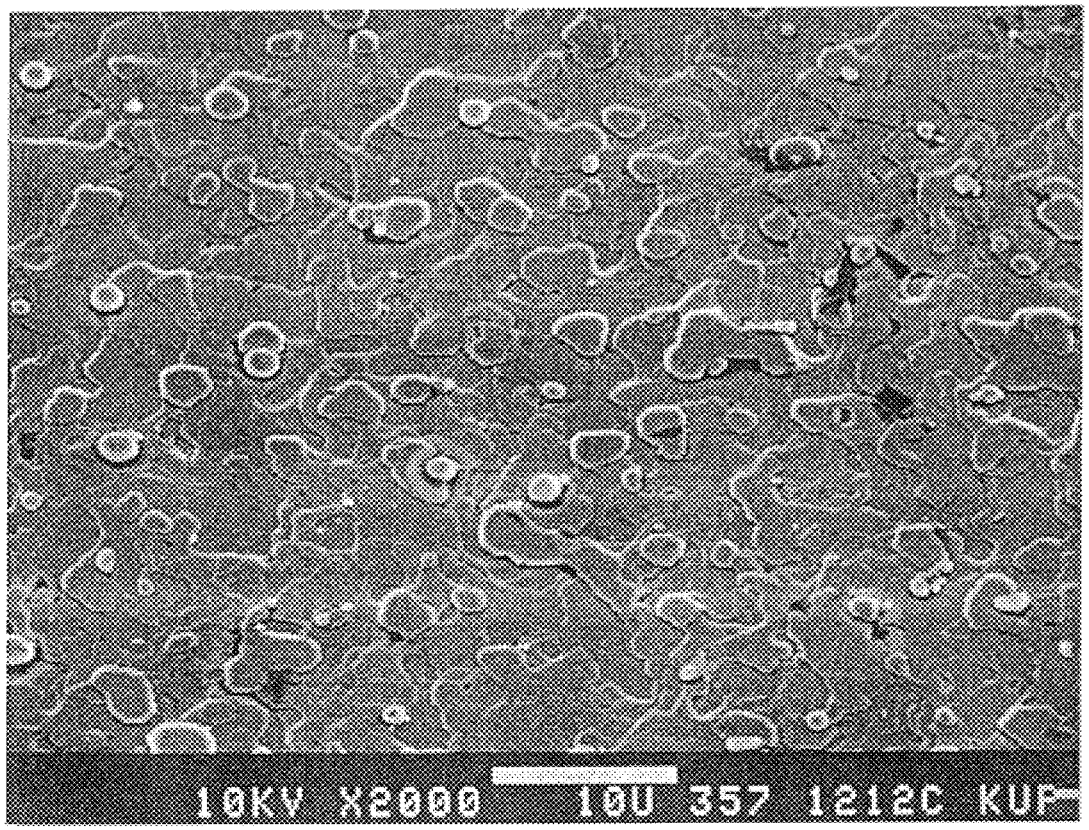
FIG. 2 is a scanning electron micrograph (SEM) of an exemplary Hg-1212 film (Run No. 3 of the Example) exhibiting condensed plate-like grains.
Figure 3:
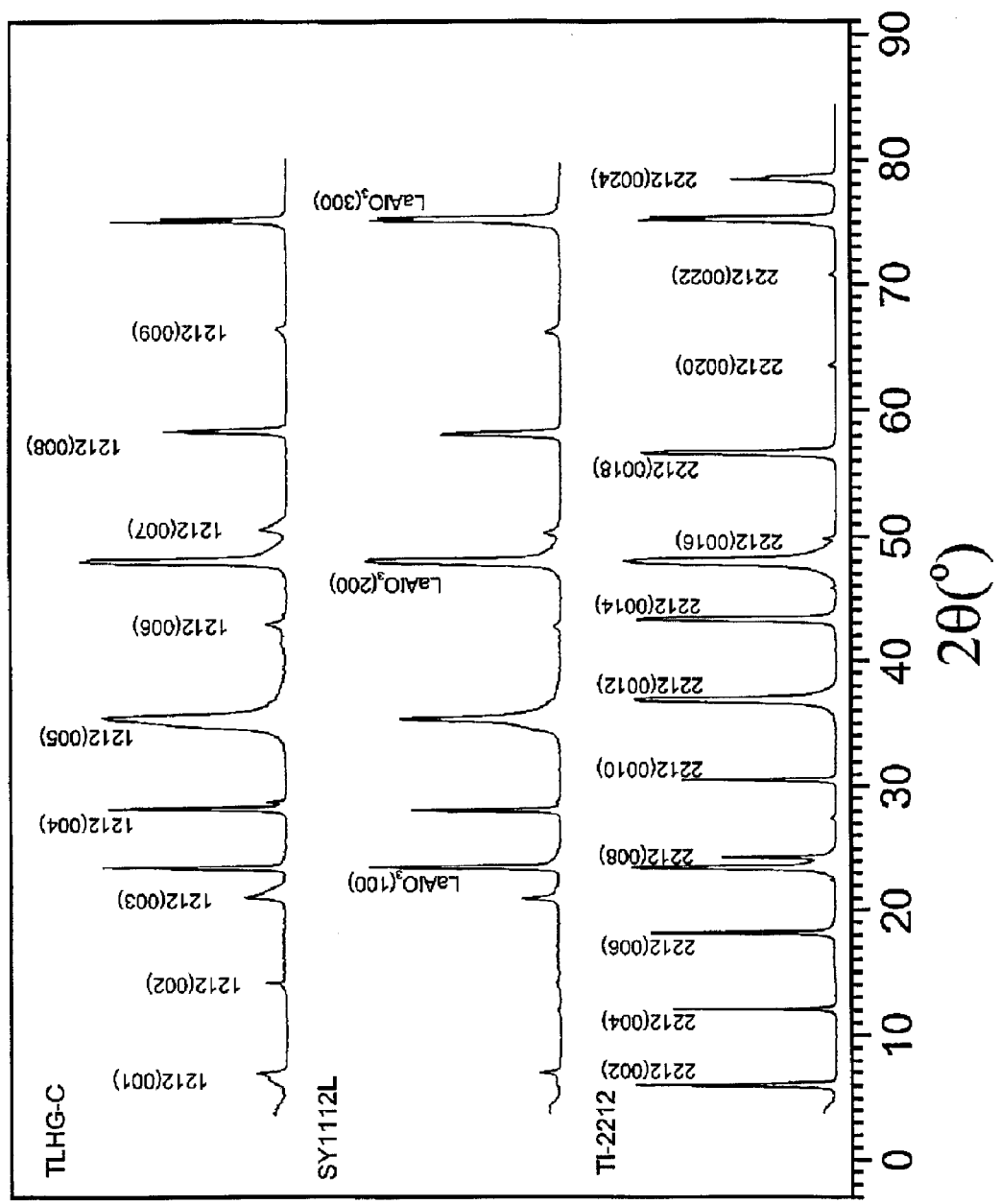
FIG. 3 is a series of XRD θ-2θ scans of a Tl-2212 original film and two Hg-1212 films (TLHG-C and SY1112L refer to Runs Nos. 3 and 14, respectively) after substitution conversion from Tl-2212 films.
Figure 4:
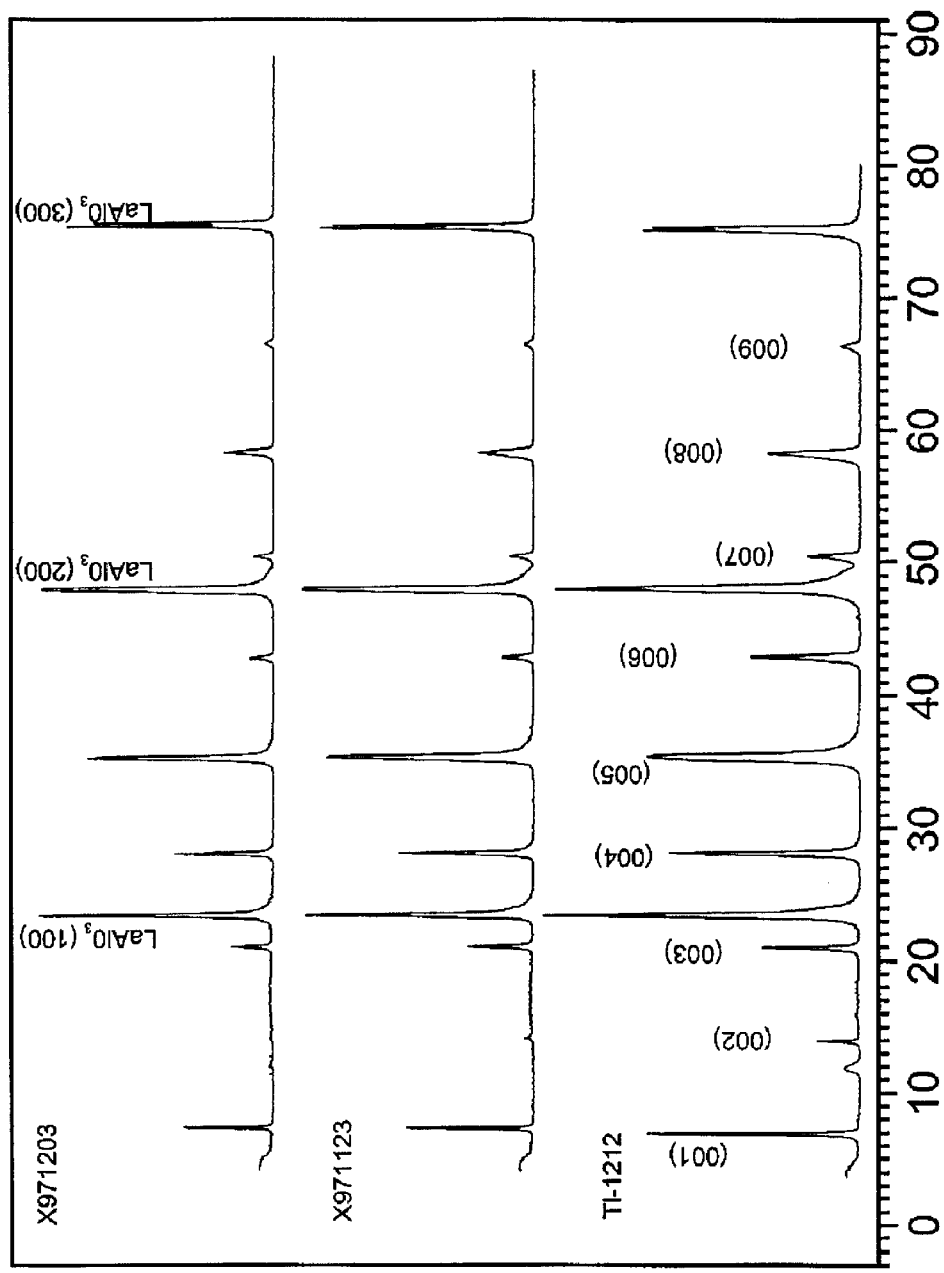
FIG. 4 is a series of XRD θ-2θ scans of a Tl-1212 original film and two Hg-1212 films (X971202 and X971123 refer to Runs Nos. 20 and 24, respectively) after substitution conversion from Tl-1212 films.
Figure 5:
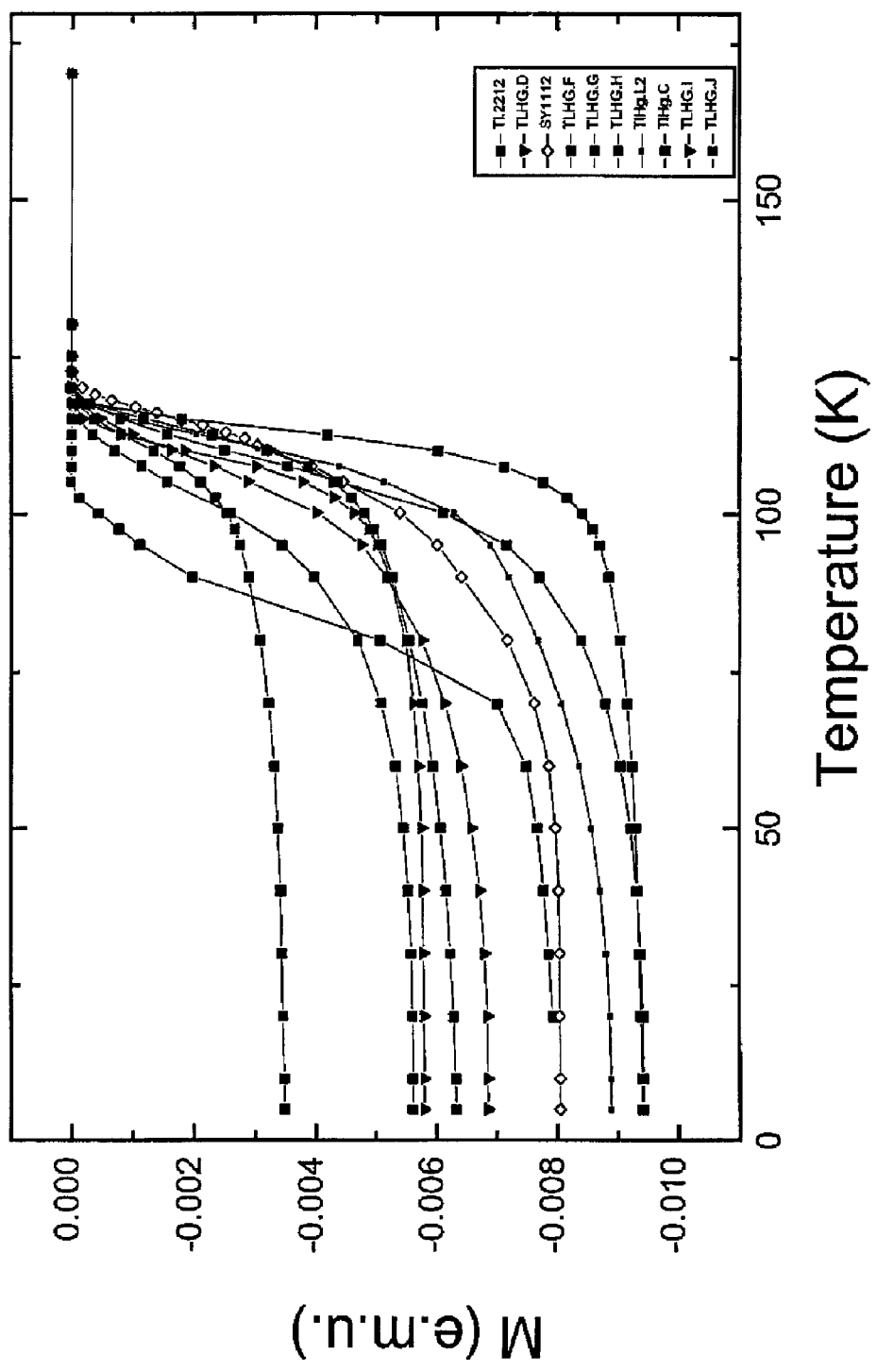
FIG. 5 is a series of critical transition curves of an original Tl-2212 film and of some Hg-1212 films after substitution conversion from Tl-2212 films (TLHG.D, SY1112, TLHG.F, TLHG.G, TLHG.H, TLHG.L2, TLHG.C, TLHG.I and TLHG.J refer to Runs Nos. 4, 14, 5, 10, 11, 9, 3, 6 and 7, respectively)
Figure 6:
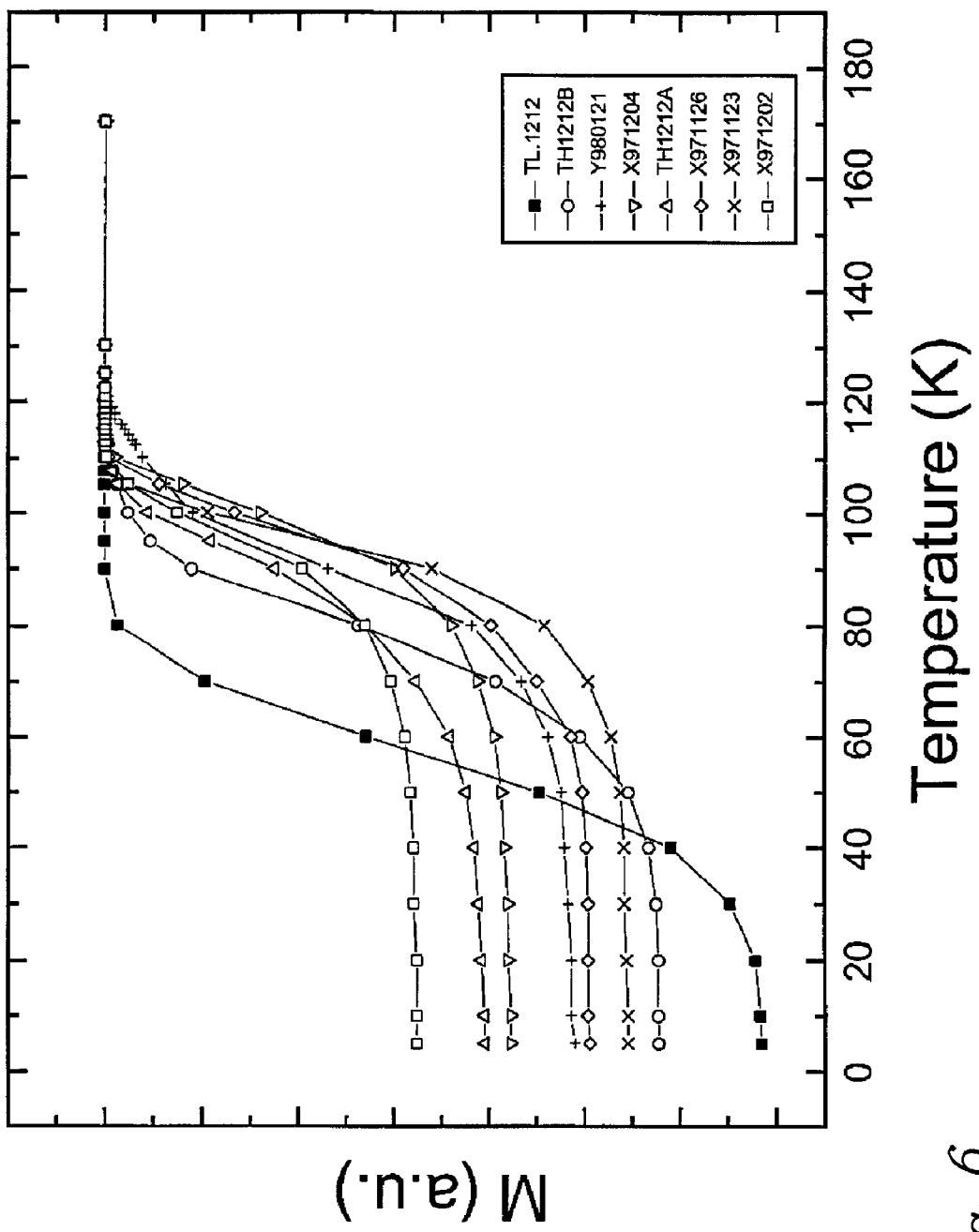
FIG. 6 is a series of critical transition curves of an original Tl-1212 film and some Hg-1212 films after substitution conversion from Tl-1212 films (TH1212B, Y980121, X971204, TH1212A, X971126, X971123 and X971202 refer to Runs Nos. 23, 22, 25, 21, 26, 24 and 20, respectively)
Figure 8:
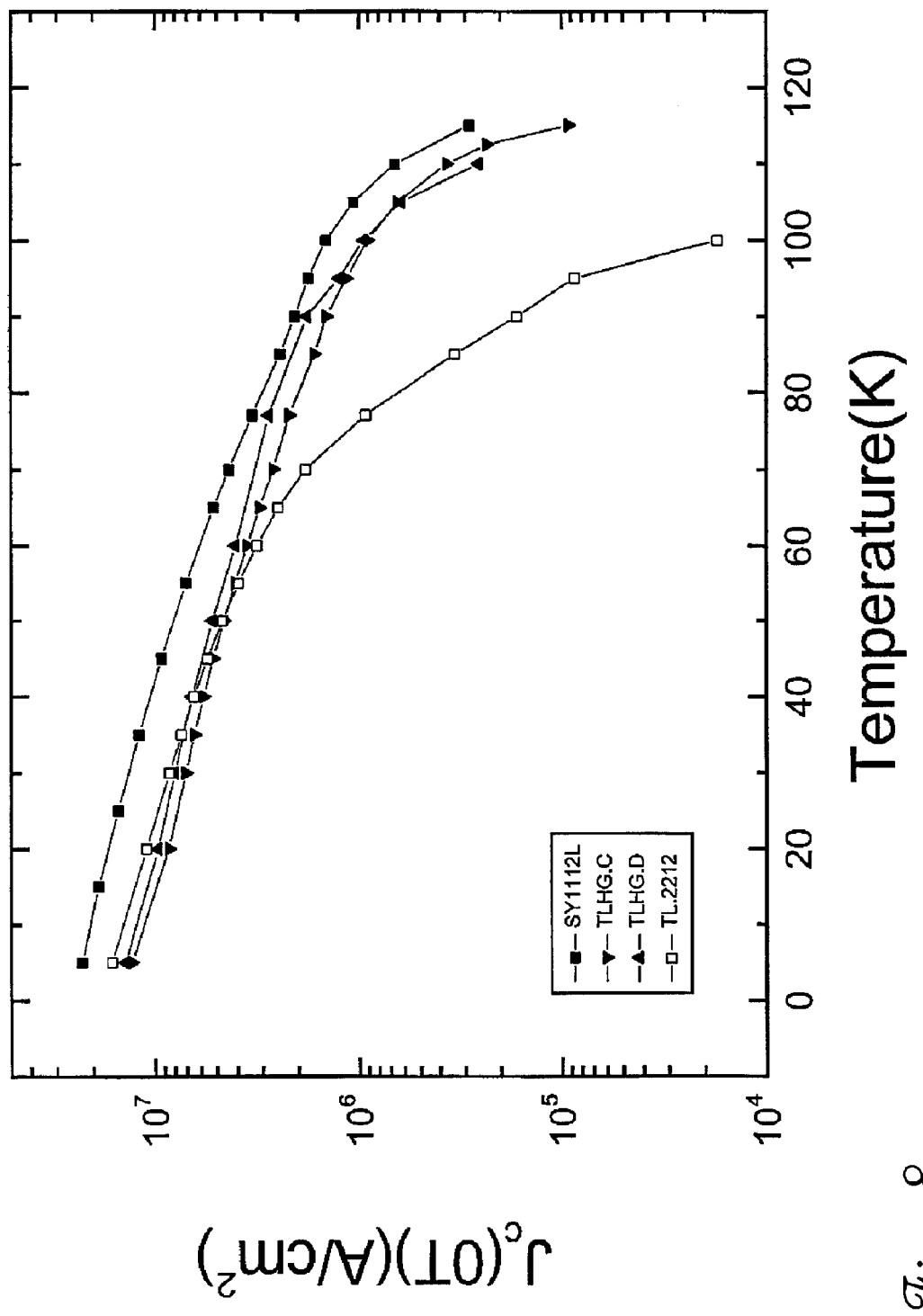
FIG. 8 is a series of critical current densities of an original Tl-2212 film and of three Hg-1212 films after substitution conversion from Tl-2212 films (SY1112L, TLHG.C, TLHG.D refer to Runs Nos. 14, 3 and 4, respectively)
Figure 9:
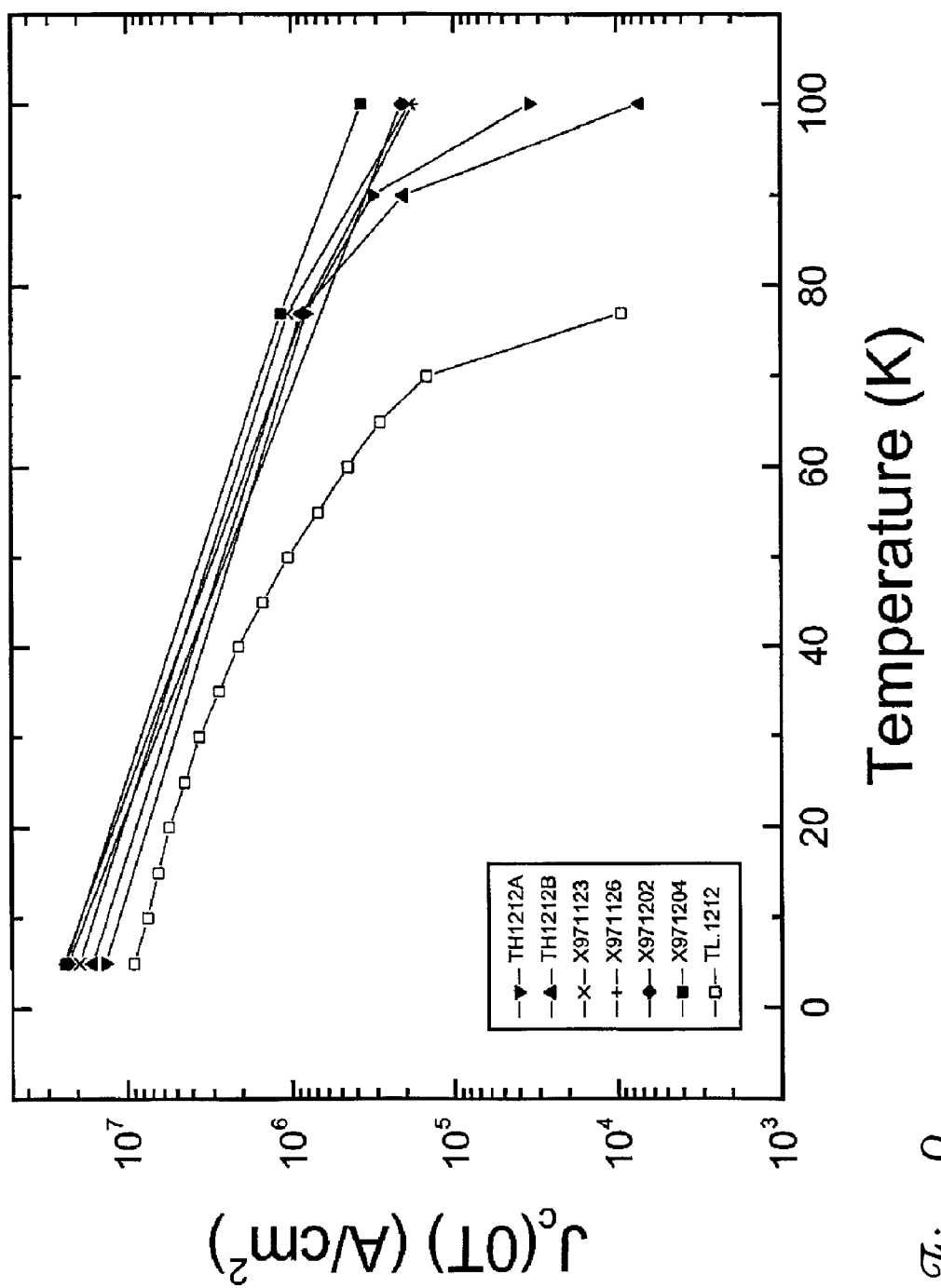
FIG. 9 is a series of critical current densities of an original Tl-1212 film and of five Hg-1212 films after substitution conversion from Tl-1212 films (TH1212A, TH1212B, X971123, X971126, X971202 and X971204 refer to Runs Nos. 21, 23, 24, 26, 20 and 25, respectively)
Figure 10:
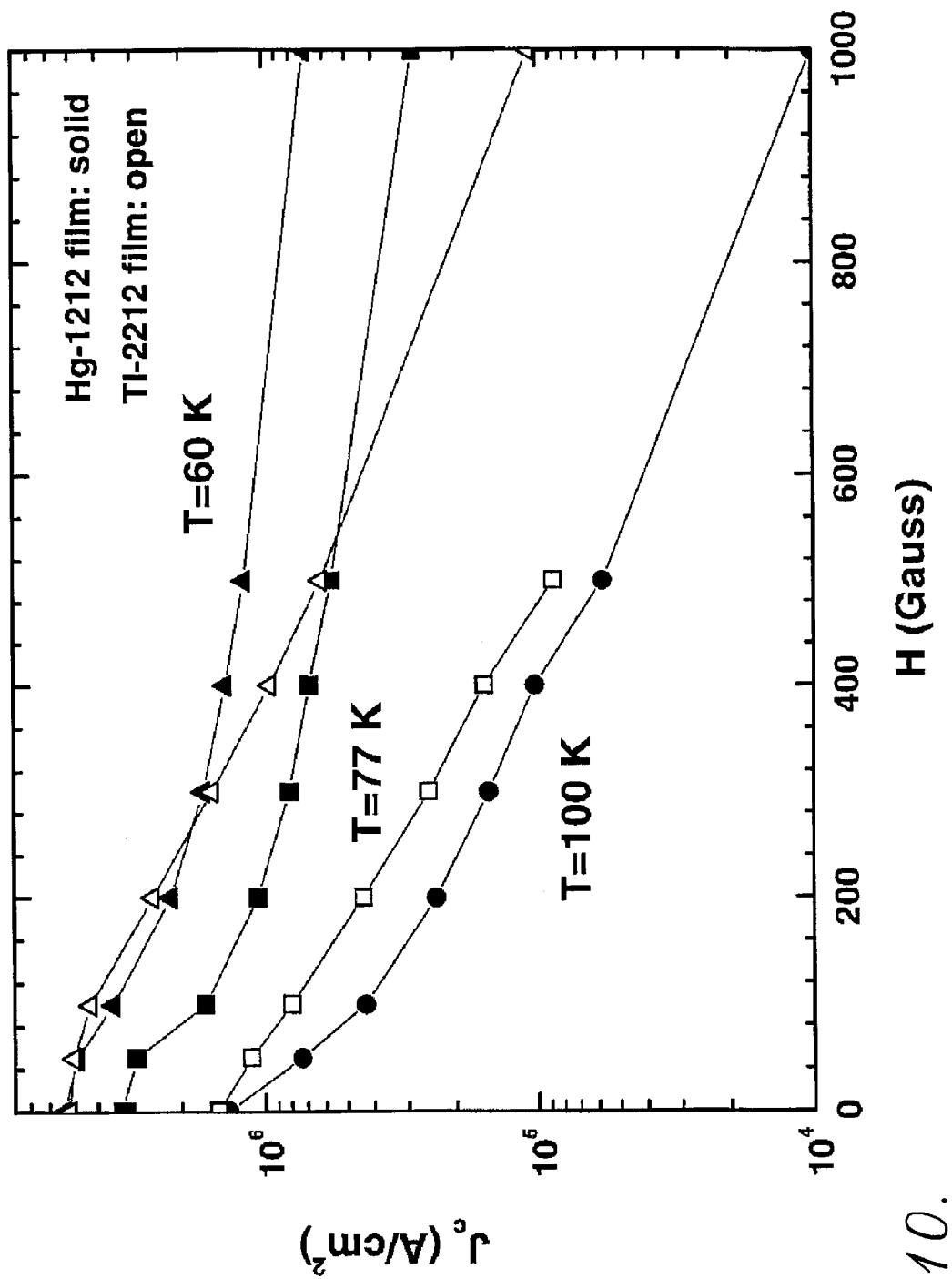
FIG. 10 is a graphical comparison of the critical current density ($J_c$) of representative Hg-1212 film (Run No. 3) and Tl-2212 film in different magnetic fields at 60 K, 77 K and 100 K.
Figure 11:
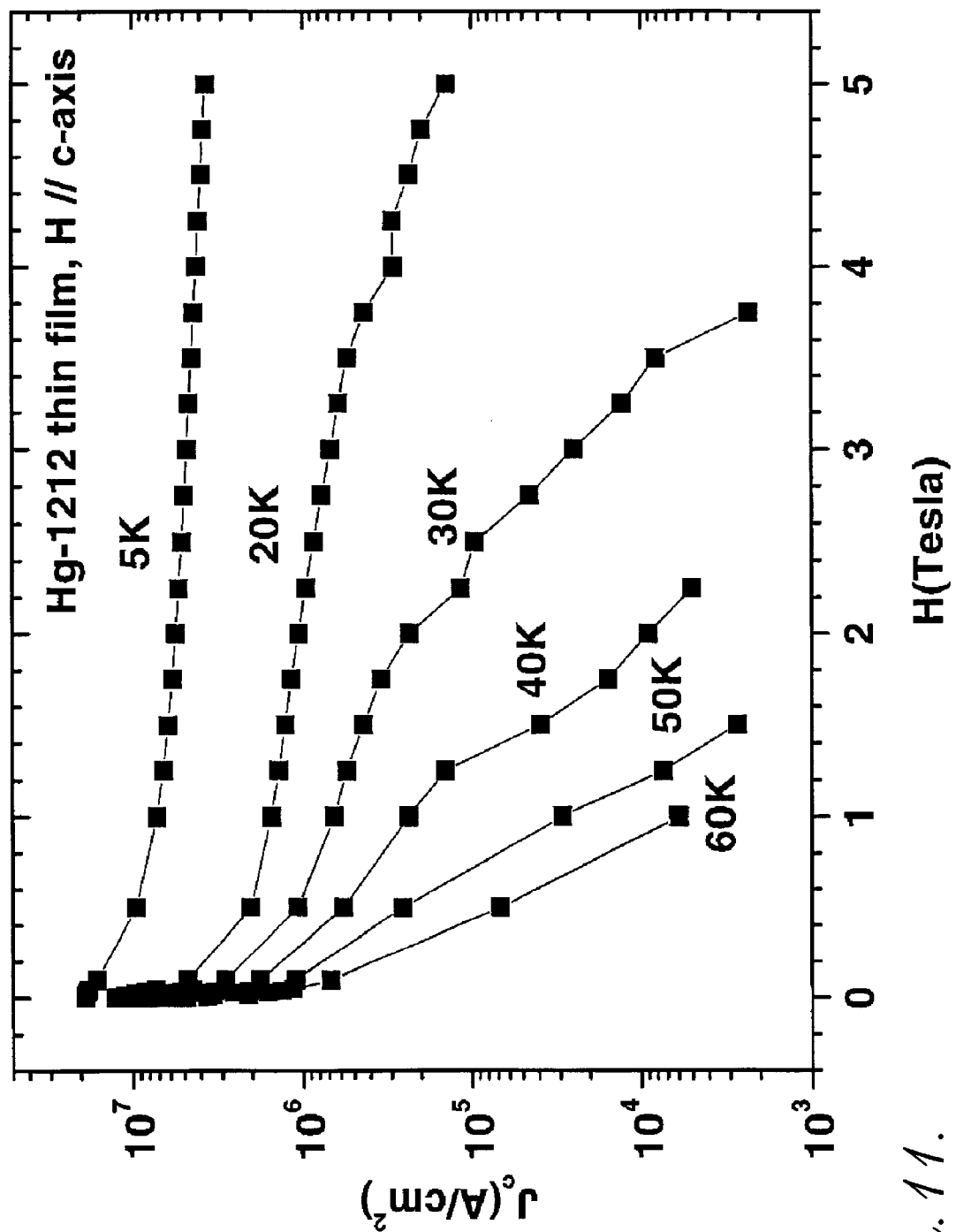
FIG. 11 is a graph illustrating the critical current density of a representative Hg-1212 film (Run No. 3) at varying magnetic fields and at different temperatures.
Figure 12:
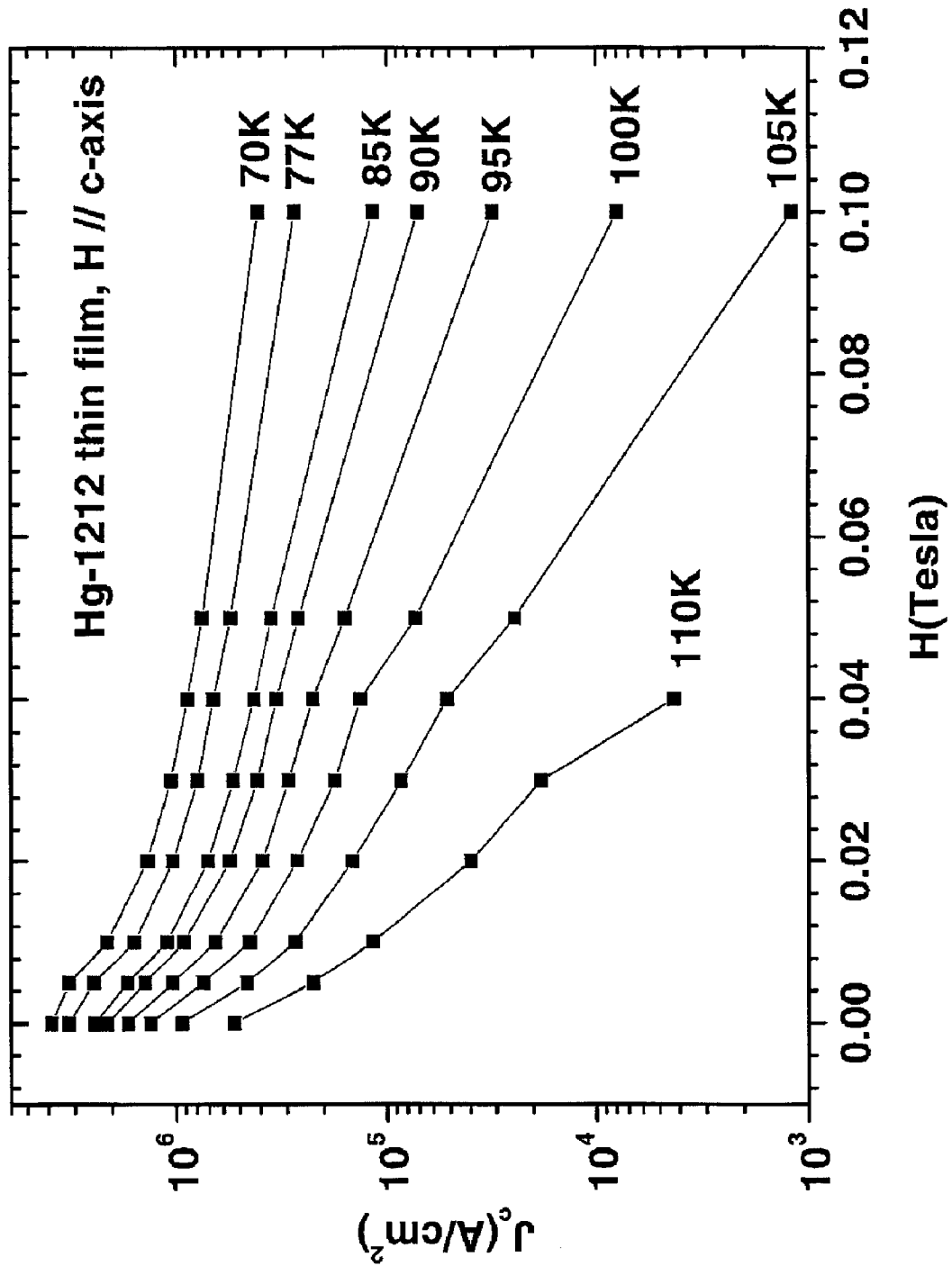
FIG. 12 is a graph similar to that of FIG. 11 and illustrates a series of critical current density readings for the same Hg-1212 film (Run No. 3) in lower magnetic fields (<0.1 T) and at higher temperatures ($\geq 70$ K)
Figure 13:
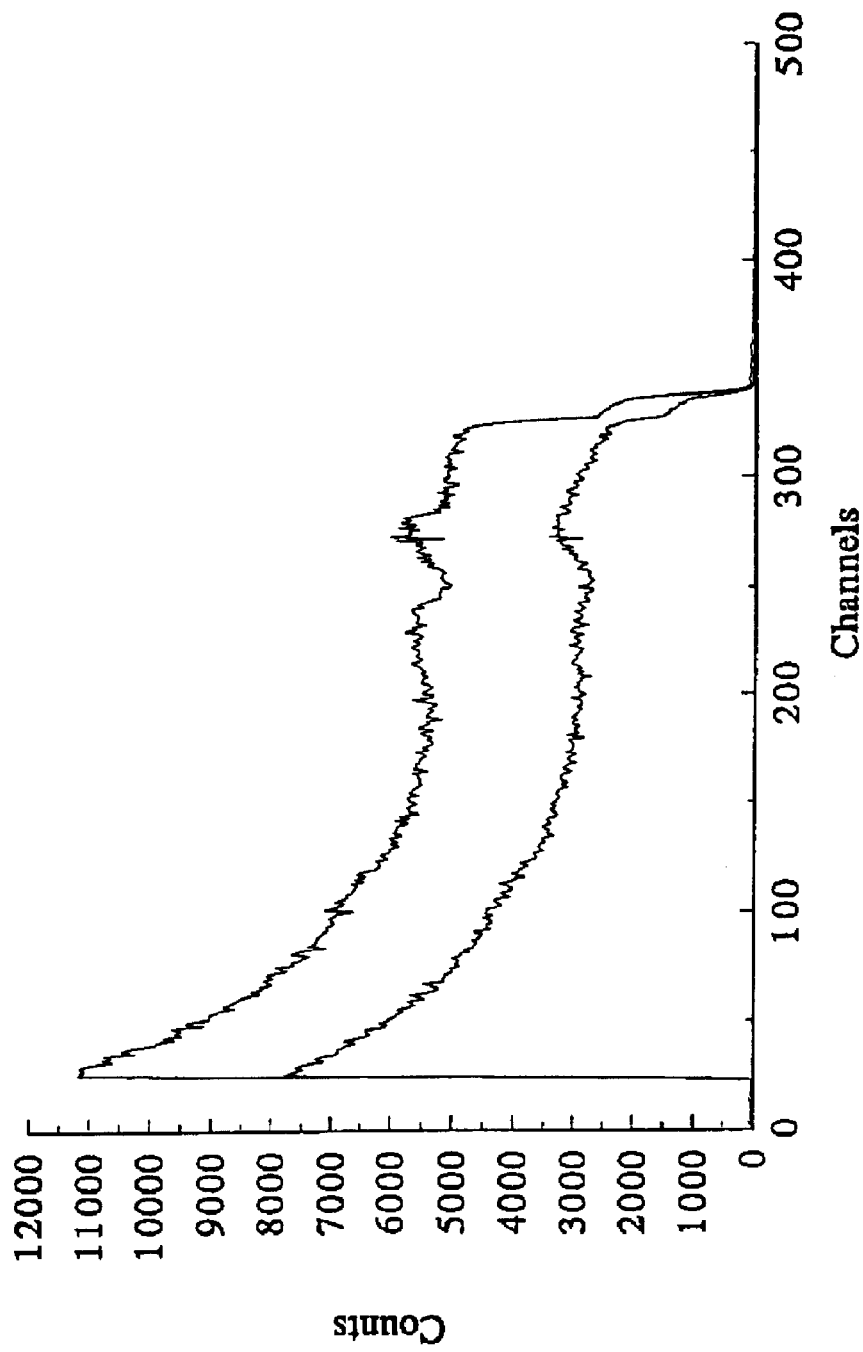
FIG. 13 is a graph illustrating RBS/channeling results with a representative Hg-1212 film (Run No. 4); the calculated $X_{min}$~40% indicates the alignment of more than 60% of the grains of the film in the plane of the $LaAlO_3$(001) substrate.

The Hg-containing bodies were in the form of cylindrical pellets (6 mm diameter×4–10 mm length) and in some cases these were slotted to receive the previously coated blocks. In other instances, the blocks were placed adjacent one end of the Hg-containing superconducting body, or sandwiched between two such bodies. Similarly, where the precursor bodies were used, these were in the form of 6 mm diameter pellets of variable length. FIG. 1 illustrates various exemplary block/pellet configurations, some of which were used in these experiments. The Hg-containing and non-Hg-containing bodies can be reacted or unreacted.

The individual blocks having the substitution-formed Hg-1212 epitaxial superconducting thin films thereon were recovered and further annealed in a tube furnace at a temperature of 300–350° C. for a period of from about 1–10 hours in a flowing oxygen environment to maximize the $T_c$ of the final films. During this final annealing step, the furnace was heated at a rate of approximately 15° C./min. up to 300° C., and after the annealing was completed, the blocks were cooled by turning off the furnace power.

The resultant Hg-substituted thin film superconductors were evaluated for $T_c$, $J_c$ at 5, 77 and 100K, surface morphology and structure, $X_{min}$, and in some instances phase purity.

Table 1 below sets forth the annealing conditions employed in the formation of the Hg-1212 superconducting films using the Tl-2212-coated blocks.

TABLE 1

| Run # | Annealing Temperature (° C.) | Annealing Period (Hrs.) | Annealing Configuration (see FIG. 1) | Pellet Composition Hg-Pellet | Pellet Composition Non Hg-Pellet | Wt. Ratio of Hg-Pellet to Non-Hg Pellet |
|---|---|---|---|---|---|---|
| 1 | 800 | 3 | H | $HgBa_2Ca_2Cu_3O_x$ | $Ba_2Ca_2Cu_3O_x$ | 3:1 |
| 2 | 790 | 3 | H | $HgBa_2Ca_2Cu_3O_x$ | $Ba_2Ca_2Cu_3O_x$ | 3:1 |
| 3 | 780 | 3 | H | $HgBa_2Ca_2Cu_3O_x$ | $Ba_2Ca_2Cu_3O_x$ | 3:1 |
| 4 | 770 | 3 | H | $HgBa_2Ca_2Cu_3O_x$ | $Ba_2Ca_2Cu_3O_x$ | 3:1 |
| 5 | 770 | 6 | H | $HgBa_2Ca_2Cu_3O_x$ | $Ba_2Ca_2Cu_3O_x$ | 3:1 |
| 6 | 760 | 3 | H | $HgBa_2Ca_2Cu_3O_x$ | $Ba_2Ca_2Cu_3O_x$ | 3:1 |
| 7 | 750 | 3 | H | $HgBa_2Ca_2Cu_3O_x$ | $Ba_2Ca_2Cu_3O_x$ | 3:1 |
| 8 | 780 | 3 | L | $HgBa_2Ca_2Cu_3O_x$ | $Ba_2Ca_2Cu_3O_x$ | 3:1 |
| 9 | 780 | 3 | H | $HgBa_2Ca_2Cu_3O_x$ | $Ba_2Ca_2Cu_3O_x$ | 3:1 |
| 10 | 770 | 3 | H | $HgBa_2Ca_2Cu_3O_x$ | $Ba_2Ca_2Cu_3O_x$ | 3:1 |
| 11 | 770 | 3 | H | $HgBa_2Ca_2Cu_3O_x$ | $Ba_2Ca_2Cu_3O_x$ | 3:1 |
| 12 | 740 | 3 | F | $Hg_{0.5}Ba_2Ca_2Cu_3O_x$ | — | — |
| 13 | 740 | 10 | F | $Hg_{0.5}Ba_2Ca_2Cu_3O_x$ | — | — |
| 14 | 700 | 12 | B | $Hg_{0.5}Ba_2Ca_2Cu_3O_x$ | — | — |
| 15 | 690 | 12 | B | $Hg_{0.5}Ba_2Ca_2Cu_3O_x$ | — | — |
| 16 | 640 | 12 | B | $Hg_{0.5}Ba_2Ca_2Cu_3O_x$ | — | — |
| 17 | 610 | 12 | A | $Hg_{0.5}Ba_2Ca_2Cu_3O_x$ | — | — |
| 18 | 720 | 12 | A | $Hg_{0.5}Ba_2Ca_2Cu_3O_x$ | — | — |
| 19 | 780 | 3 | H | $HgBa_2CaCu_2O_x$ | $Ba_2CaCu_2O_x$ | 3:1 |

Table 2 sets forth the characterizing data developed from testing the films of Table 1.

TABLE 2

| Run # | $T_c$ (K) | $J_c$ (×10⁶ A/cm²) 5K | 77K | 100K | Phase Purity (%) | Surface Morphology | Structure |
|---|---|---|---|---|---|---|---|
| 1 | 115 | 1.63 | — | — | 93.6 | Plate-like grains and impurity particles | C-axis oriented |
| 2 | 115 | 5.79 | 0.38 | 0.13 | 94.2 | Plate-like grains and impurity particles | C-axis oriented |
| 3 | 120 | 13.1 | 2.23 | 0.91 | 89.6 | Bright, dense plate-like grains | C-axis oriented |
| 4 | 120 | 14.0 | 2.78 | 0.95 | 79.9 | Bright, plate-like grains and small holes | C-axis oriented |
| 5 | 120 | 10.9 | 1.12 | 0.37 | 85.4 | Bright, dense plate-like grains and small holes | C-axis oriented |
| 6 | 120 | 14.9 | 1.57 | 0.53 | 66.5 | Plate-like grains and small holes | C-axis oriented |
| 7 | 117 | 10.5 | 0.94 | 0.26 | 76.5 | Plate-like grains and small holes | C-axis oriented |
| 8 | 122 | 6.1 | 0.70 | 0.20 | 88.8 | Plate-like grains and tiny particles | C-axis oriented |
| 9 | 120 | 17.2 | 1.96 | 0.83 | 87.9 | Dense plate-like grains | C-axis oriented |
| 10 | 120 | 16.1 | 1.98 | 0.82 | 85.0 | Plate-like grains and small holes | C-axis oriented |
| 11 | 120 | 18.1 | 1.92 | 0.64 | 63.0 | Plate-like grains and small holes | C-axis oriented |
| 12 | — | — | — | — | 70.0 | Dense small grains | C-axis oriented |
| 13 | — | — | — | — | 50.0 | Plate-like grains and holes | C-axis oriented |
| 14 | 124 | 22.6 | 3.09 | 1.18 | 96.0 | Bright dense uniform surface | C-axis oriented |
| 15 | 118 | 16.5 | — | — | 82.0 | Bright dense uniform surface | C-axis oriented |
| 16 | — | — | — | — | 65.0 | Bright dense uniform surface | C-axis oriented |
| 17 | — | — | — | — | 10.0 | Bright dense uniform surface | C-axis oriented |
| 18 | 120 | 17.7 | 1.81 | 0.71 | 85.0 | Plate-like grains and holes | C-axis oriented |
| 19 | 122 | — | — | — | — | | |

Table 3 below gives the annealing conditions used in the formation of the Hg-1212 superconducting films using the Tl-1212-coated blocks.

TABLE 3

| Run # | Annealing Temperature (C.°) | Annealing Period (Hrs.) | Film and Pellets Position | Pellet Composition Hg-Pellet | Non Hg-Pellet | Wt. Ratio of Hg-Pellet to Non-Hg Pellet |
|---|---|---|---|---|---|---|
| 20 | 810 | 3 | A | $HgBa_2Ca_2Cu_3O_x$ | — | — |
| 21 | 780 | 3 | H | $HgBa_2Ca_2Cu_3O_x$ | $Ba_2Ca_2Cu_3O_x$ | 3:1 |
| 22 | 780 | 3 | H | $HgBa_2Ca_2Cu_3O_x$ | $Ba_2Ca_2Cu_3O_x$ | 3:1 |
| 23 | 750 | 3 | H | $HgBa_2Ca_2Cu_3O_x$ | $Ba_2Ca_2Cu_3O_x$ | 3:1 |
| 24 | 750 | 20 | A | $HgBa_2Ca_2Cu_3O_x$ | $Ba_2Ca_2Cu_3O_x$ | 3:1 |
| 25 | 750 | 20 | A | $Hg_{0.75}Ba_2Ca_2Cu_3O_x$ | — | |
| 26 | 750 | 20 | A | $H_{0.5}Ba_2Ca_2Cu_3O_x$ | — | |

Table 4 gives the characterizing data developed from testing the films of Table 3.

TABLE 4

| Run # | $T_c$ (K) | $J_c$ ($\times 10^6$ A/cm$^2$) | | | Phase Purity (%) | Surface Morphology | Structure |
|---|---|---|---|---|---|---|---|
| | | 5K | 77K | 100K | | | |
| 20 | 112 | 22.7 | $9.4 \times 10^{-3}$ | — | — | smooth | C-axis oriented |
| 21 | 115 | 13.6 | 0.88 | 0.04 | — | smooth | C-axis oriented |
| 22 | 122 | 21.2 | 1.1 | 0.11 | — | smooth | C-axis oriented |
| 23 | 115 | 16.1 | 0.98 | 0.01 | — | smooth | C-axis oriented |
| 24 | 117 | 19.4 | 1.0 | 0.2 | — | smooth | C-axis oriented |
| 25 | 114 | 23.5 | 1.2 | 0.4 | — | smooth | C-axis oriented |
| 26 | 112 | 24.2 | 0.8 | 0.2 | — | smooth | C-axis oriented |

FIGS. 2–13 further exemplify the characteristics of the Hg-containing superconducting thin films of this example. Thus, in FIGS. 5 and 6, critical temperature transition curves are provided which confirm that the $T_c$ values of the Tl-containing films are substantially lower than those of the substituted Hg-containing films. Likewise, FIGS. 8–10 set forth critical current density data and establishes that at high temperature (>90K), the critical current densities of the Hg-1212 films are much larger than those of the Tl-1212 and Tl-2212 films.

EXAMPLE 2

Figure 14:
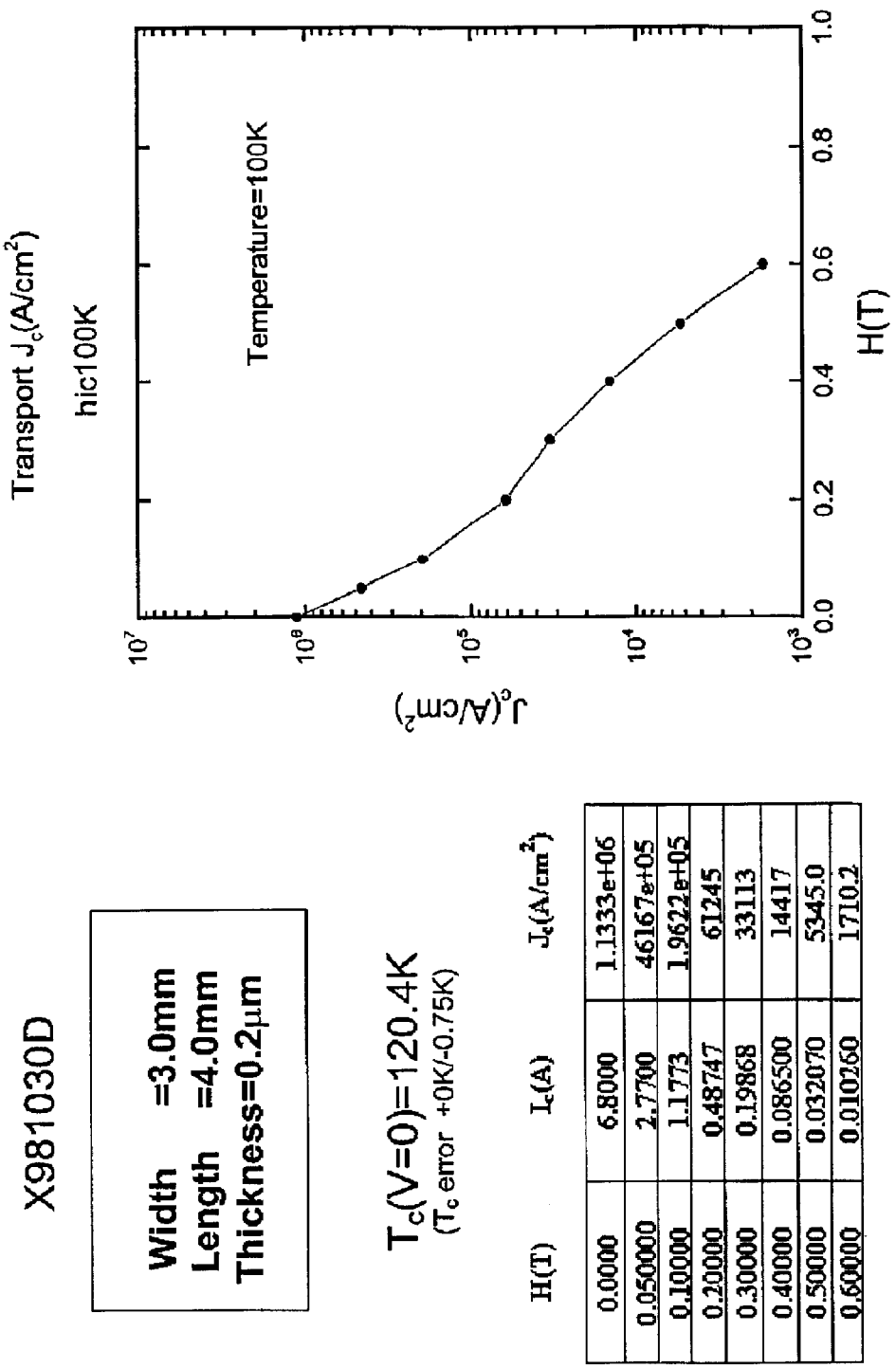
FIG. 14 is a graph illustrating the transport critical current density ($J_c$) at varying temperatures of an Hg-1212 film prepared according to the processes of the invention.

In this example, an Hg-1212 epitaxial film was produced following the procedures set forth in Example 1. The resultant Hg-substituted thin film superconductor was evaluated for transport $J_c$ at 100K and varying magnetic fields. The results of this evaluation are depicted in FIG. 14 where it can be seen that the transport $J_c$ at zero magnetic field was $10^6$ A/cm$^2$.

EXAMPLE 3

Figure 15:
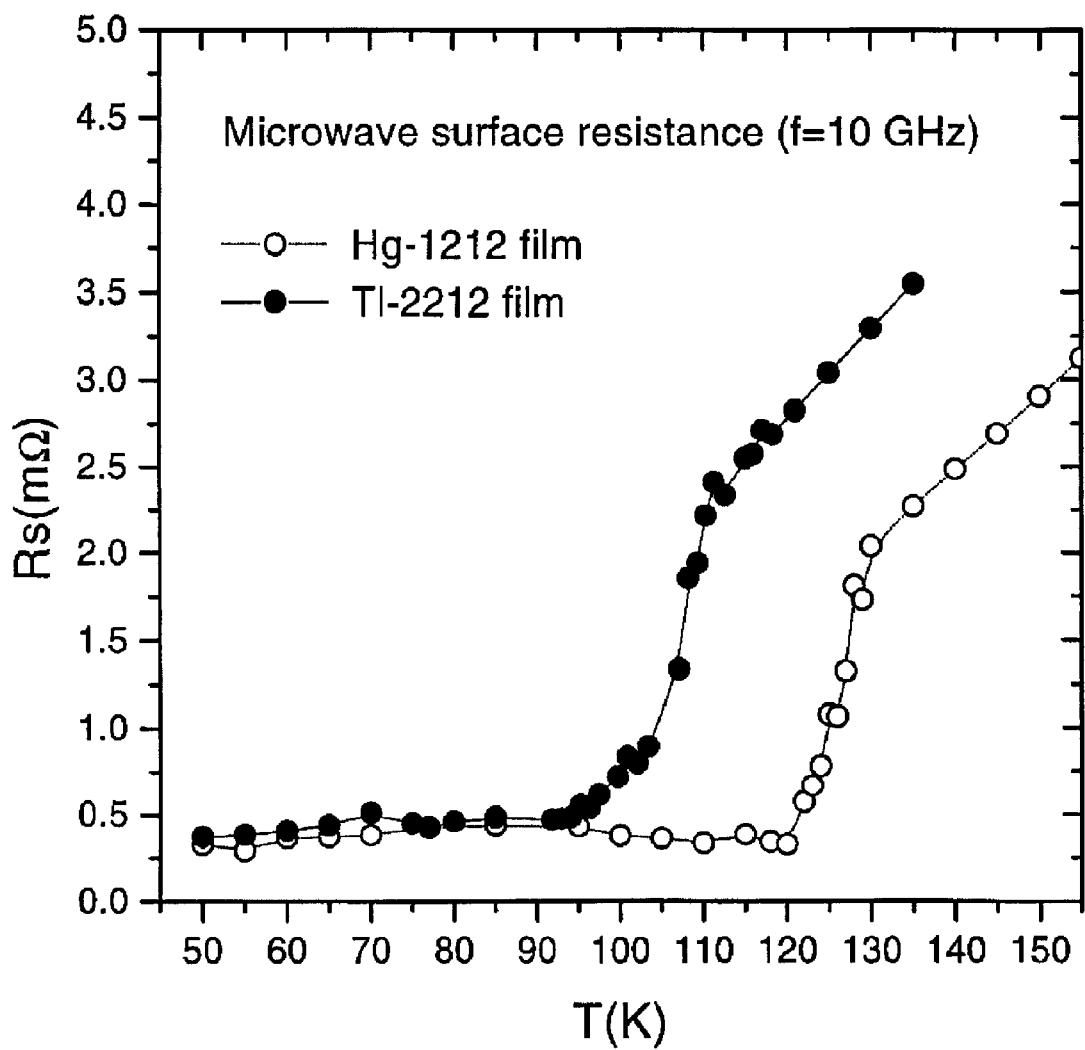
FIG. 15 is a graph illustrating the microwave surface resistance of Tl-2212 and Hg-1212 films processed according to the processes of the invention.

In this example, an Hg-1212 epitaxial film was prepared following the procedures set forth in Example 1. The intermediate Tl-2212 film and the resultant Hg-substituted film were evaluated for their microwave surface resistance at 10 GHz and varying temperatures. As illustrated in FIG. 15, at 115 K and 10 GHz, a resistance of 0.3 milliohms was observed for the Hg-1212 films. This resistance has never been achieved at 115K by prior art films.

EXAMPLE 4

Figure 16:
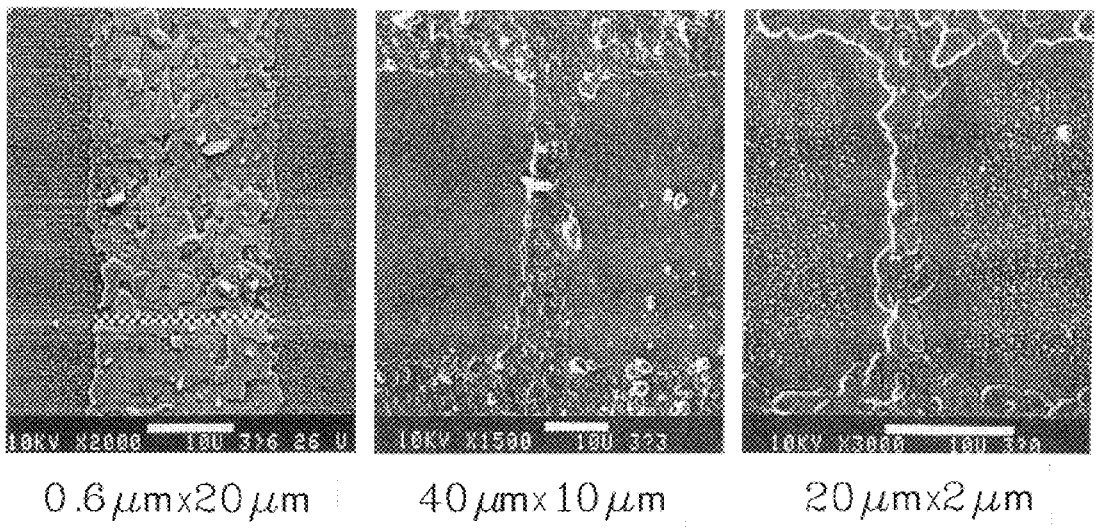
FIG. 16 is an SEM photograph showing Hg-vapor annealed Tl-2212 micro-bridges having widths of 20 $\mu$m, 10 $\mu$m, and 2 $\mu$m at magnifications of 2000×, 1500×, and 3000×.
Figure 17:
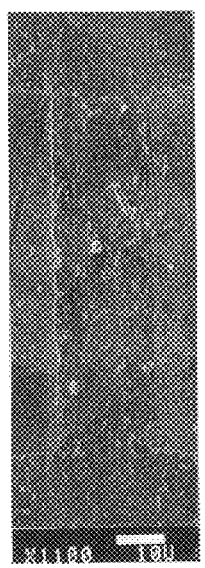
FIG. 17 is an SEM photograph (1100×) showing Hg-1212 micro-bridges having widths of 20 $\mu$m and 10 $\mu$m.
Figure 17:
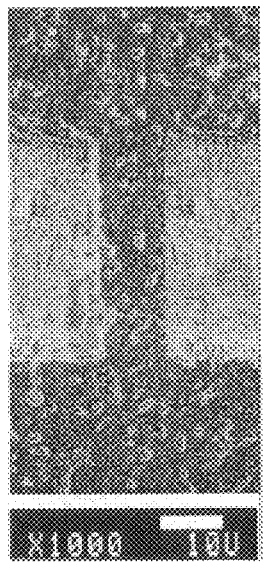
Figure 18:
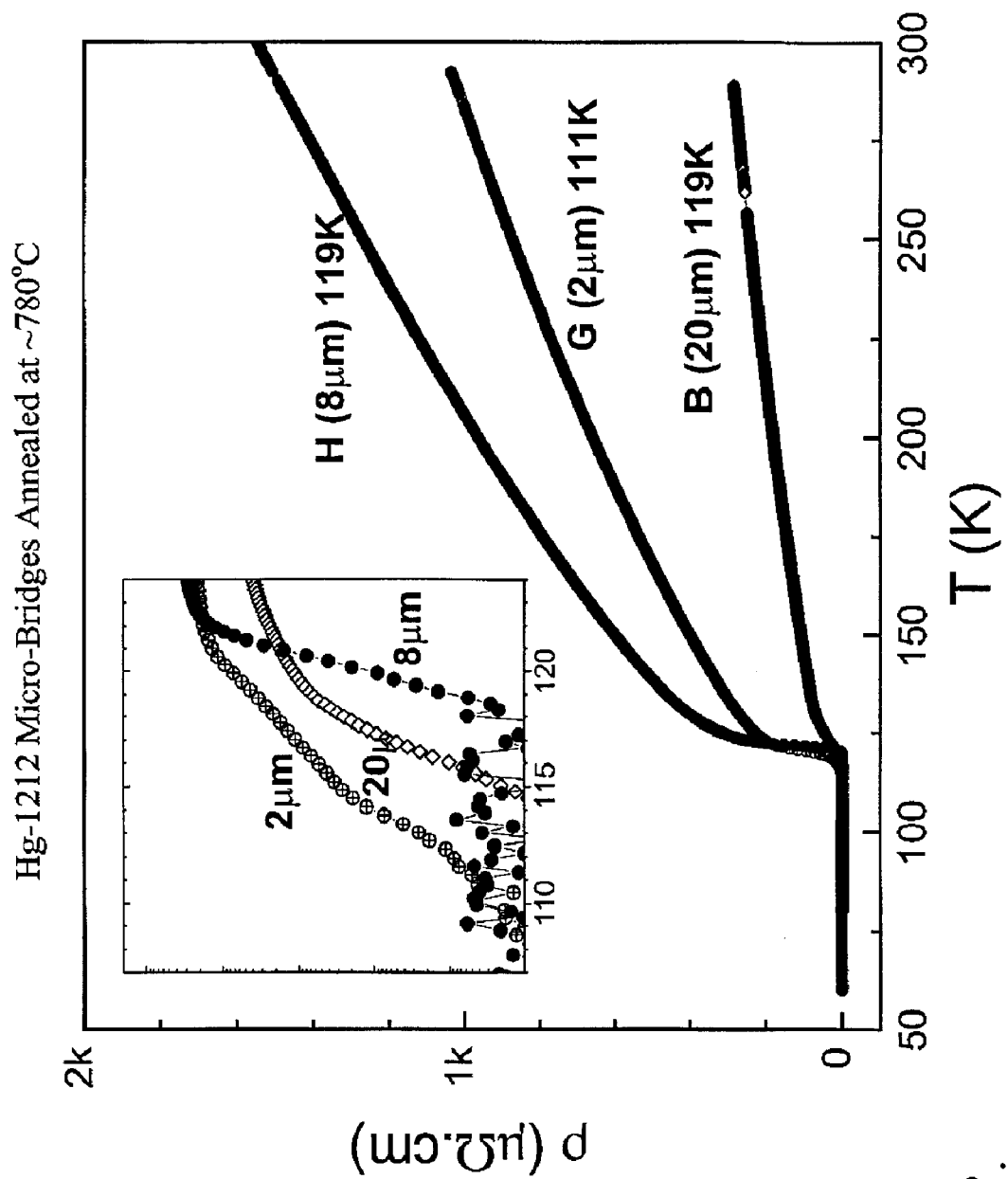
FIG. 18 is a graph illustrating the resistance vs. temperature behaviors of H-1212 micro-bridges processed according to the processes of the invention and annealed at 780° C.
Figure 19:
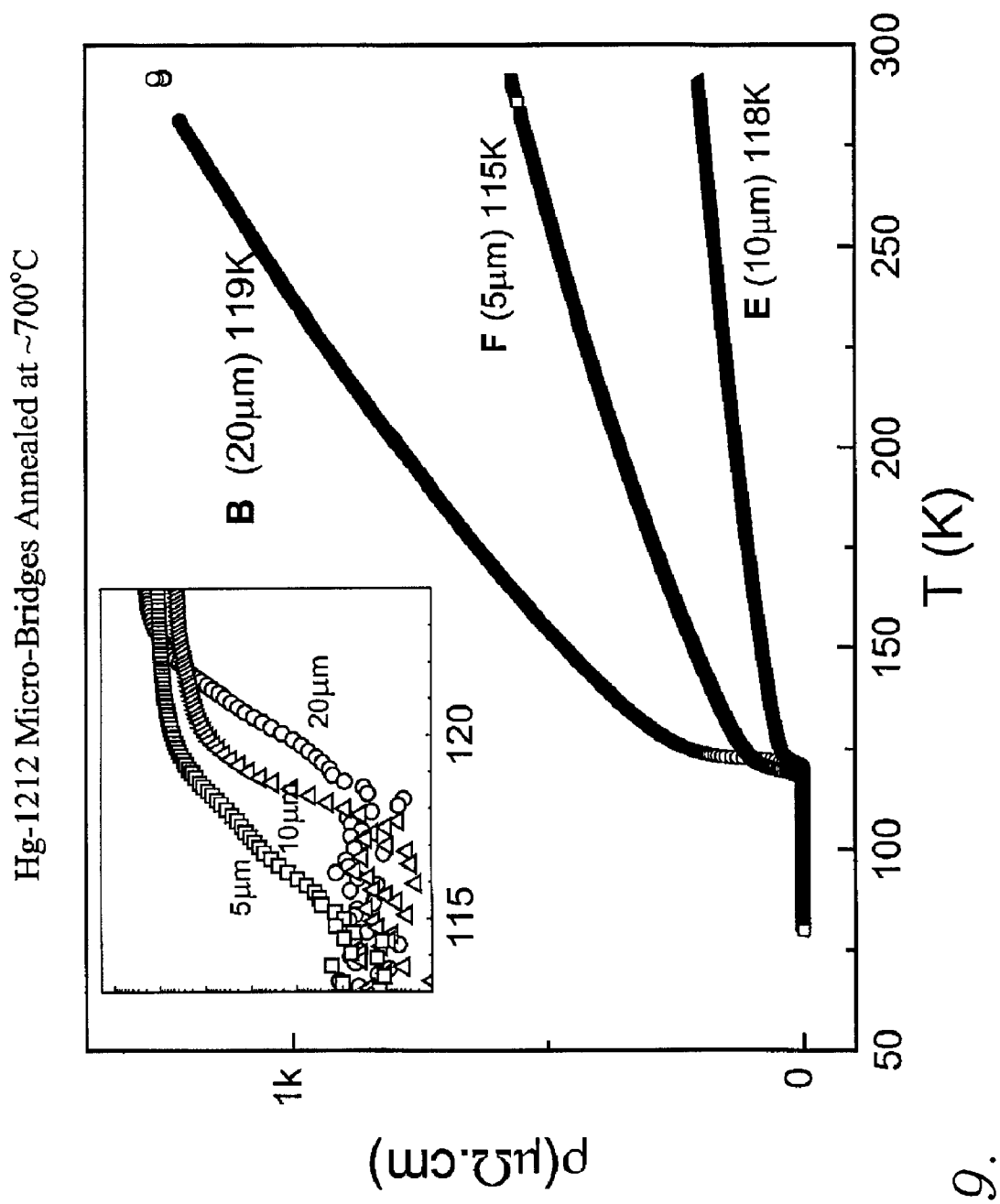
FIG. 19 is a graph illustrating the resistance vs. temperature behaviors of H-1212 micro-bridges processed according to the processes of the invention and annealed at 700° C.
Figure 20:
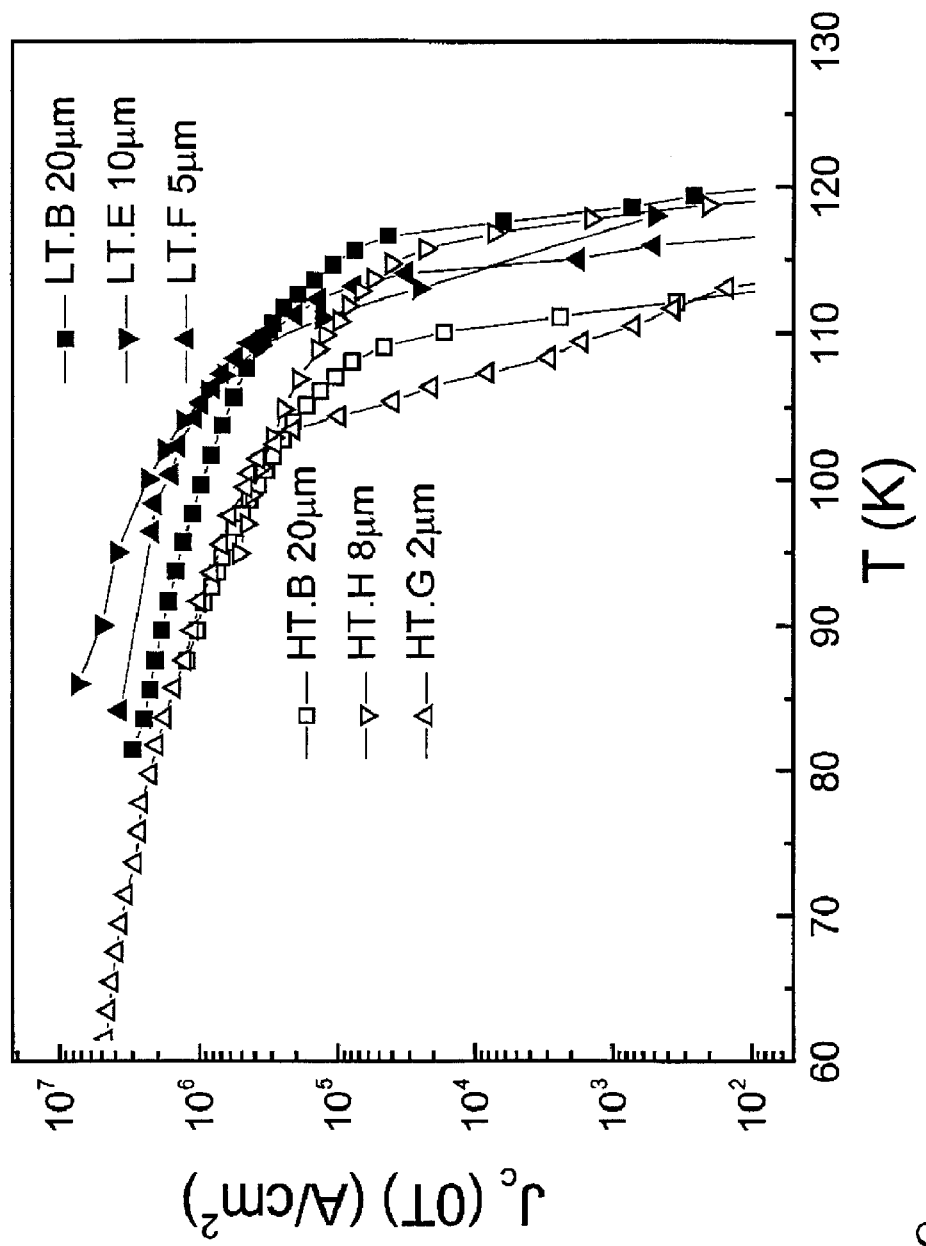
FIG. 20 is a graph illustrating the transport critical density ($J_c$) at varying temperatures of Hg-1212 micro-bridges having varying widths and processed according to the processes of the invention and annealed at 780° C. ("HT") and 700° C. ("LT").

In this example, Tl-2212 films were prepared as described in Example 1. The films were then etched using conventional photolithography processes to form micro-bridges of various widths in the film. The Tl forming the micro-bridges was then replaced by Hg also as described in Example 1, with three micro-bridges each being annealed at 780° C. for 3 hours (SEM of bridges shown in FIG. 16) and two micro-bridges each being annealed at 700° C. for 12 hours (SEM of bridges shown in FIG. 17). FIGS. 18 and 19 depict the resistivity versus temperature of the bridges while FIG. 20 illustrates the transport $J_c$. The $T_c$ values of these micro bridges are in the range of 110–120K and the transport $J_c$ values are in the range of 0.5 to $2.3 \times 10^6$ A/cm$^2$ at 100K and 0 magnetic field. A value of $2.3 \times 10^6$ A/cm$^2$ at 100K has not been achieved by prior art superconductors. These results indicate that Hg-based superconducting microelectronic devices can be converted directly from Tl-based superconducting devices.

FABRICATION OF THERMOELECTRIC MATERIALS

A similar process as that described above with respect to films can be utilized to synthesize highly volatile compounds which would otherwise be difficult, if not impossible, to synthesize. First, a precursor matrix is selected. The matrix should have a similar structure and composition to that of the final, target material. The matrix should also have at least one weakly bonded molecule (e.g., "molecule A") which will be replaced by the desired molecule (e.g., "molecule B") to form the target material. Molecule A is perturbed (i.e., energy is applied to the precursor matrix), causing molecule A to vibrate around the equilibrium site where the Gibbs free energy is minimized. It will be appreciated that the spacial deflection of molecule A is proportional to the energy of perturbation. In the inventive processes, the perturbation energy is maintained close to, but below, the threshold perturbation energy ($U_{th}$). $U_{th}$ is the point at which the deflection of molecule A would be comparable to the lattice constant, thus causing the precursor matrix to collapse as a result of the rapid escape of many molecules A from the matrix. By maintaining the perturbation energy below $U_{th}$, the overall structure of the precursor is maintained while allowing molecule A to slowly escape. A vapor of molecule B is simultaneously introduced, resulting in a molecule B replacing essentially each molecule A as it escapes from the structure.

One type of material particularly useful in this process is the skutterudite. Skutterudites filled with volatile rattlers can be fabricated from basic skutterudites (i.e., $MX_3$, where M is a metal atom and X is preferably a pnicogen atom) or from skutterudites filled with less volatile (relative to the rattlers) molecules.

This process offers numerous advantages over the prior art. First, it is a kinetic process that can be carried out over a wide processing window in contrast to the narrow processing window required by the phase equilibrium of conventional thermal reaction processes. Also, the exchange occurs at an atomic scale. Therefore, the generated compound inherits the qualities (e.g., phase purity, crystalline structure, surface morphology) of the precursor matrix. This makes synthesis of the compounds much simpler and improves the quality of the final compounds as the precursor matrices are generally readily obtainable in high quality forms.

The remaining Examples are directed towards the preparation of improved thermoelectric materials according to the invention.

EXAMPLE 5

Basic, non-filled skutterudites are prepared according to the known prior art methods. The skutterudites are then heated in an evacuated vessel to temperatures of from about 500–1000° C. Hg vapor is simultaneously introduced into the vessel at a vapor pressure of from about 1–10 atm, causing Hg molecules to fill the skutterudites after a time period of about 30–200 minutes.

EXAMPLE 6

Skutterudites filled with Pb molecules are prepared according to known prior art methods. The Pb-filled skutterudites are then heated in an evacuated vessel to a temperature of at least about 500° C. While the vessel is maintained at this temperature, Hg vapor is introduced into the vessel at a vapor pressure of from about 1–10 atm so that Hg molecules replace the Pb molecules as they are released from the skutterudites, forming skutterudites filled with Hg molecules.

We claim:

1. A method of fabricating an Hg-containing film superconductor comprising the steps of:

providing a body comprising a substrate having a Tl-based superconducting film supported on a surface thereof; and annealing said body in the presence of Hg vapor under conditions whereby at least a portion of the Tl of said superconducting film is replaced by Hg to form said Hg-containing film.

2. The method of claim 1, including the step of carrying out said annealing at a temperature of from about 600–900° C. for a period of from about 1–20 hours.

3. The method of claim 2, said temperature being from about 640–800° C., and said period being from about 2–15 hours.

4. The method of claim 1, said annealing step comprising the steps of placing said body in a tube along with an Hg-containing superconducting pellet, drawing a vacuum in said tube, closing the ends thereof, and placing the closed tube in an annealing furnace.

5. The method of claim 1, said Tl-based superconducting film being selected from the group consisting of Tl-1212, Tl-2212, Tl-1223 and Tl-2223 films.

6. The method of claim 1, said Hg-containing film being selected from the group consisting of Hg-1212 and Hg-1223 films.

7. The method of claim 1, said Hg-containing film having a thickness of from about 0.005–500 $\mu$m.

8. The method of claim 7, said thickness being from about 0.1–1 $\mu$m.

9. The method of claim 1, said Hg-containing film having a $J_c$ of at least about $10^6$ A/cm$^2$ at 100K and zero magnetic field.

10. The method of claim 1, said Hg-containing film having a $X_{min}$ of up to about 50%.

11. The method of claim 10, said $X_{min}$ being from about 10–40%.

12. The method of claim 1, further including the step of removing at least part of said Tl-based superconducting film to form bridges prior to said annealing step.

13. The method of claim 12, wherein said removing step comprises:

applying a photoresist composition over said Tl-based superconducting film;

exposing said photoresist composition to activating radiation;

developing said exposed photoresist composition layer; and etching said developed photoresist composition layer.

14. The method of claim 1, said film having a microwave surface resistance of less than about 0.4 m$\Omega$ at 120K.

* * * * *